United States Patent
Han et al.

(10) Patent No.: US 11,132,487 B2
(45) Date of Patent: Sep. 28, 2021

(54) METHOD OF DESIGNING A LAYOUT OF A PATTERN, METHOD OF FORMING A PATTERN USING THE SAME, AND METHOD OF MANUFACTURING A SEMICONDUCTOR DEVICE USING THE SAME

(71) Applicant: SAMSUNG ELECTRONICS CO., LTD., Suwon-si (KR)

(72) Inventors: Kyubin Han, Incheon (KR); Sangwook Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/856,216

(22) Filed: Apr. 23, 2020

(65) Prior Publication Data

US 2021/0117604 A1    Apr. 22, 2021

(30) Foreign Application Priority Data

Oct. 17, 2019   (KR) .................... 10-2019-0128844

(51) Int. Cl.
*G06F 30/392* (2020.01)
*H01L 21/033* (2006.01)

(52) U.S. Cl.
CPC ........ *G06F 30/392* (2020.01); *H01L 21/0337* (2013.01)

(58) Field of Classification Search
USPC .......................................................... 716/55
See application file for complete search history.

(56) References Cited

U.S. PATENT DOCUMENTS

| | | | |
|---|---|---|---|
| 7,010,764 B2 | 3/2006 | Pierrat | |
| 7,303,845 B2 | 12/2007 | Okada et al. | |
| 8,015,511 B2 | 9/2011 | Krasnoperova et al. | |
| 8,416,412 B2 | 4/2013 | Schellhorn et al. | |
| 8,898,598 B1 | 11/2014 | Zhang et al. | |
| 10,001,698 B2 | 6/2018 | Chang | |
| 2015/0016731 A1* | 1/2015 | Kitajima | G06K 9/6203 382/199 |
| 2018/0149967 A1 | 5/2018 | Lai et al. | |
| 2019/0018325 A1* | 1/2019 | Kim | G03F 1/36 |

FOREIGN PATENT DOCUMENTS

CN          101750876 A      6/2010

* cited by examiner

*Primary Examiner* — Bryce M Aisaka
(74) *Attorney, Agent, or Firm* — Lee IP Law, PC

(57) ABSTRACT

A layout of original pattern is rotated in a rotational direction to form a layout of rotation pattern. Vertices and segment points of the layout of rotation pattern are matched with ones of the reference points closest thereto, and the matched reference points are connected to form a layout of first modification pattern. A region of the layout of first modification pattern is enlarged to form a layout of second modification pattern. A layout of reference pattern having the same direction as the layout of rotation pattern is formed. A layout of target pattern is formed based on a region where the layouts of reference pattern and second modification pattern overlap. An optical proximity correction is performed on the layout of target pattern to form a layout of third modification pattern, which is rotated in a reverse rotational direction to form a layout of final pattern.

20 Claims, 28 Drawing Sheets

FIG. 2
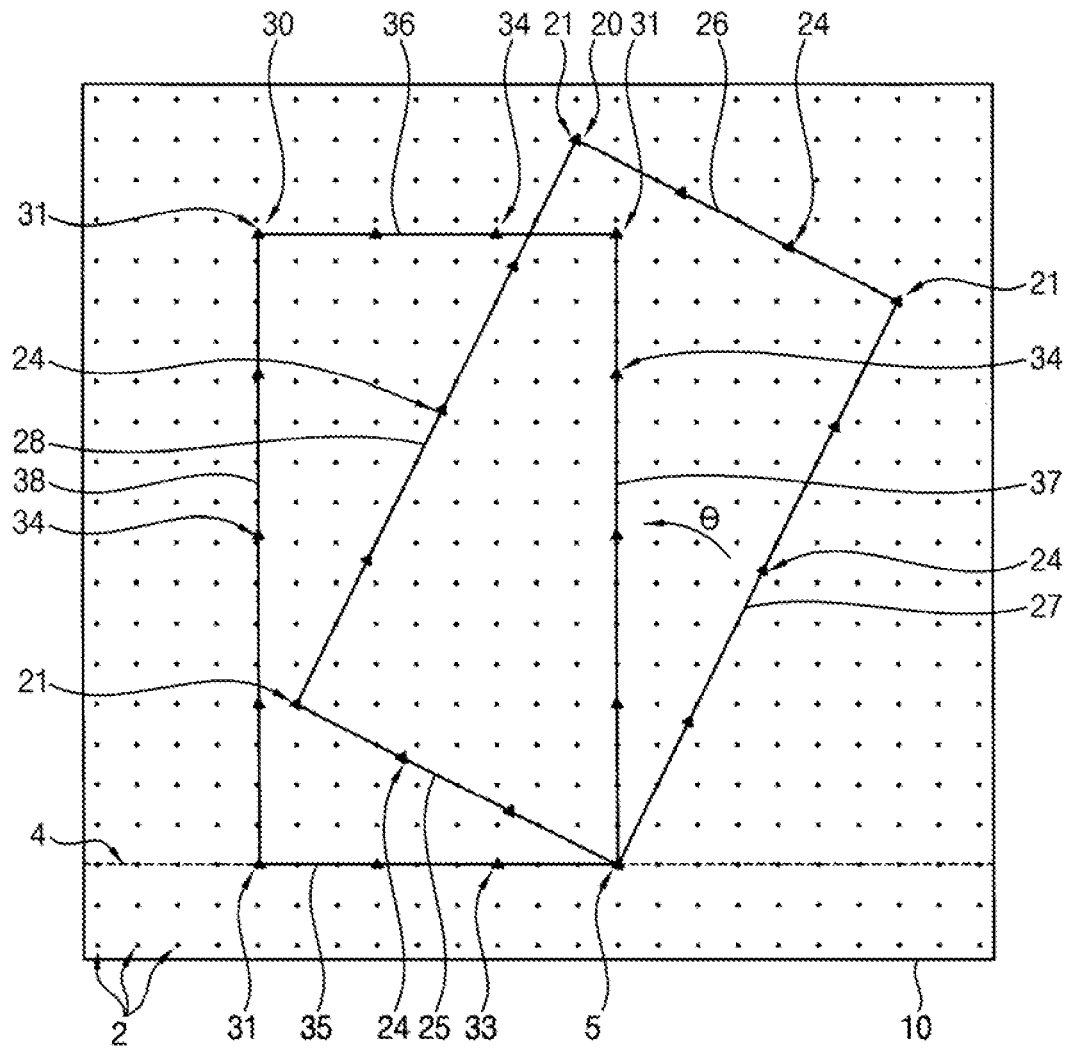
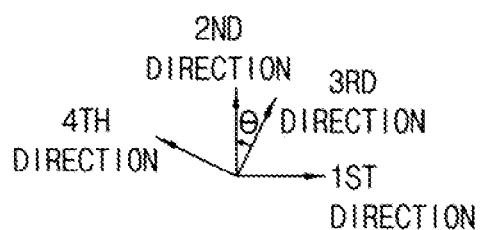

FIG. 6
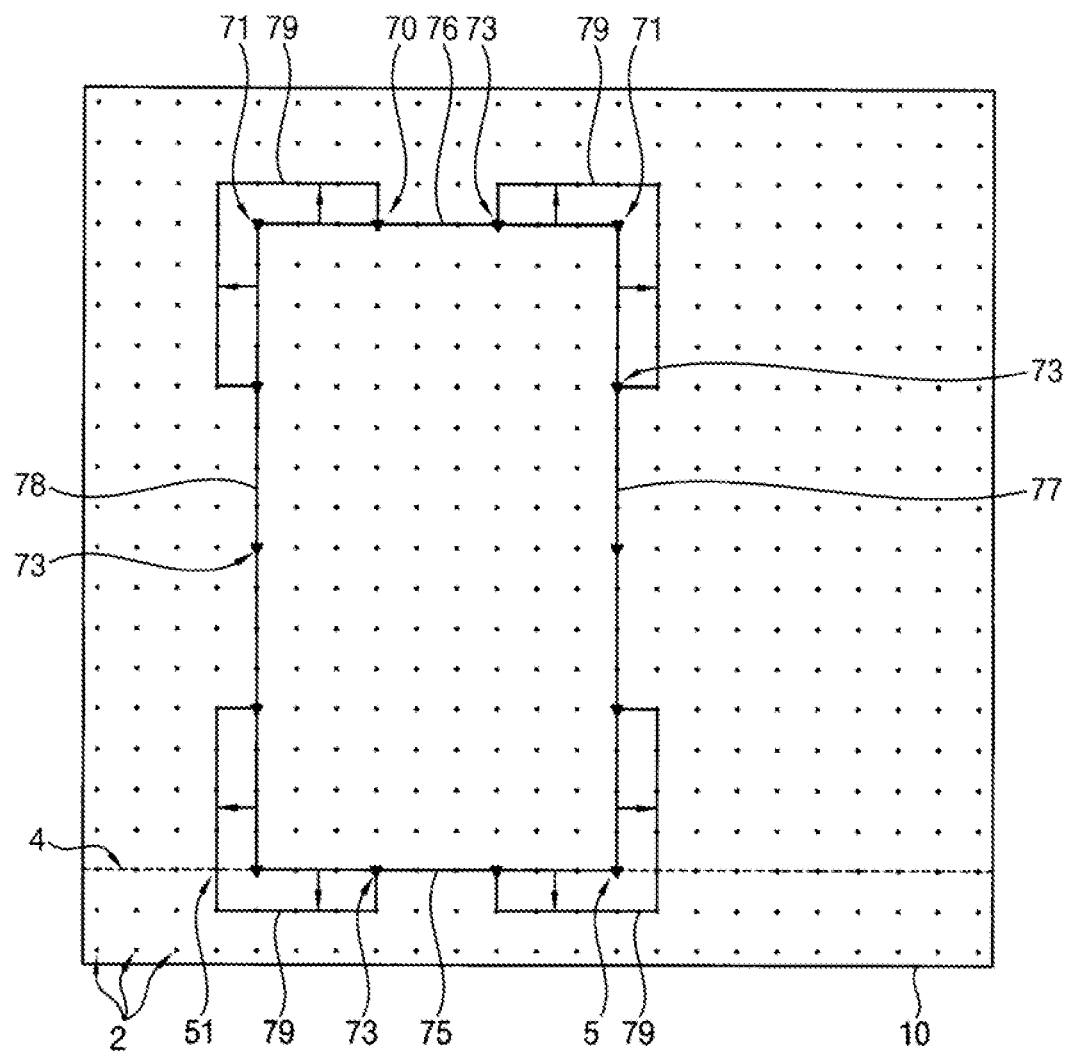
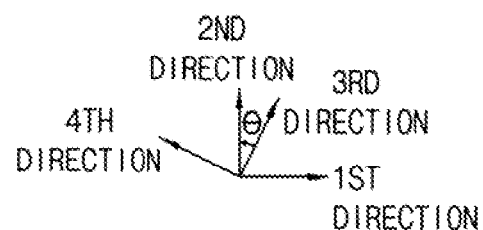

FIG. 7
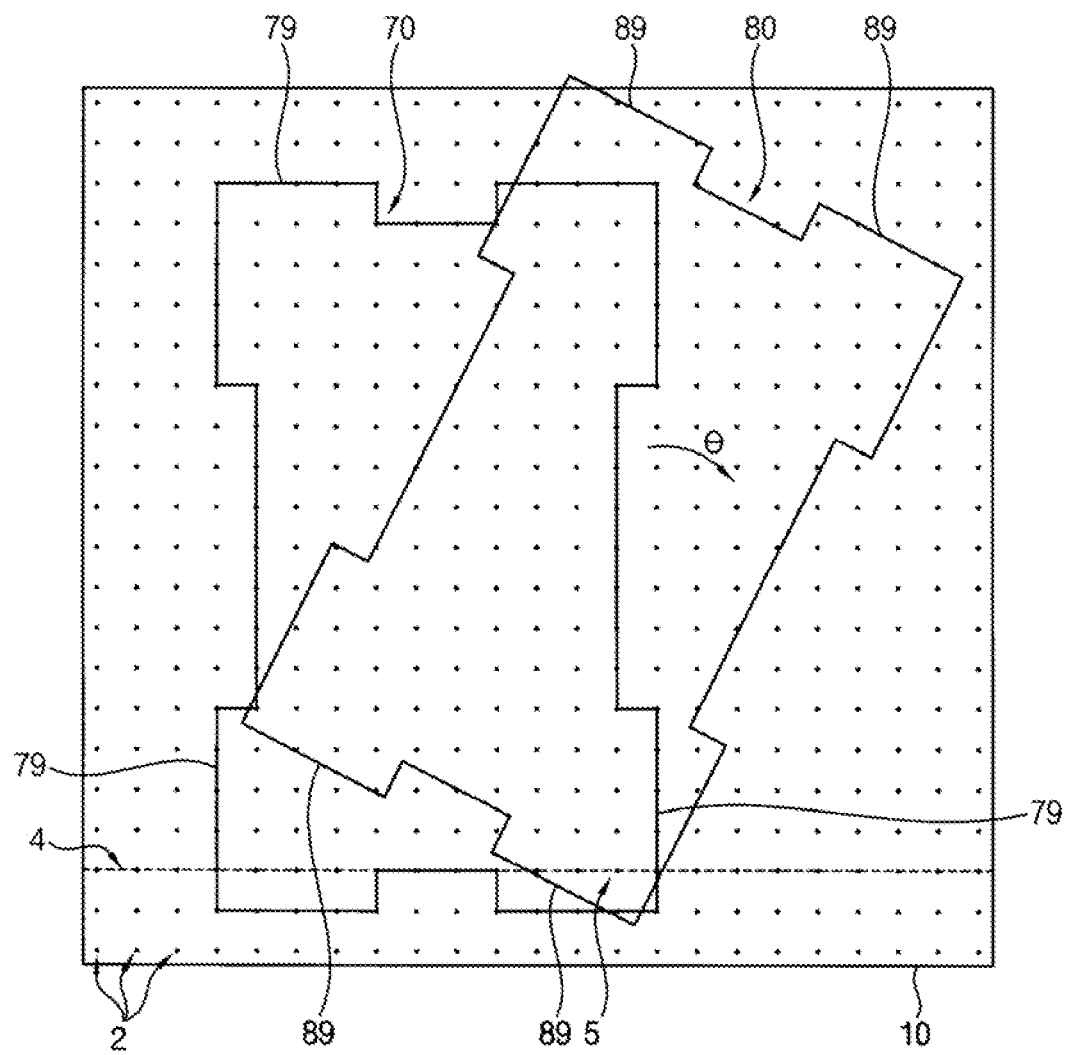
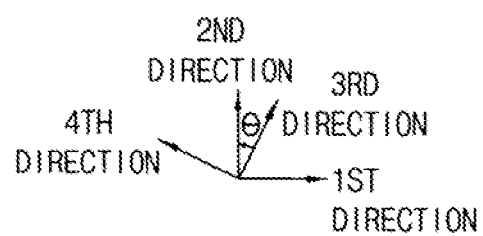

FIG. 8
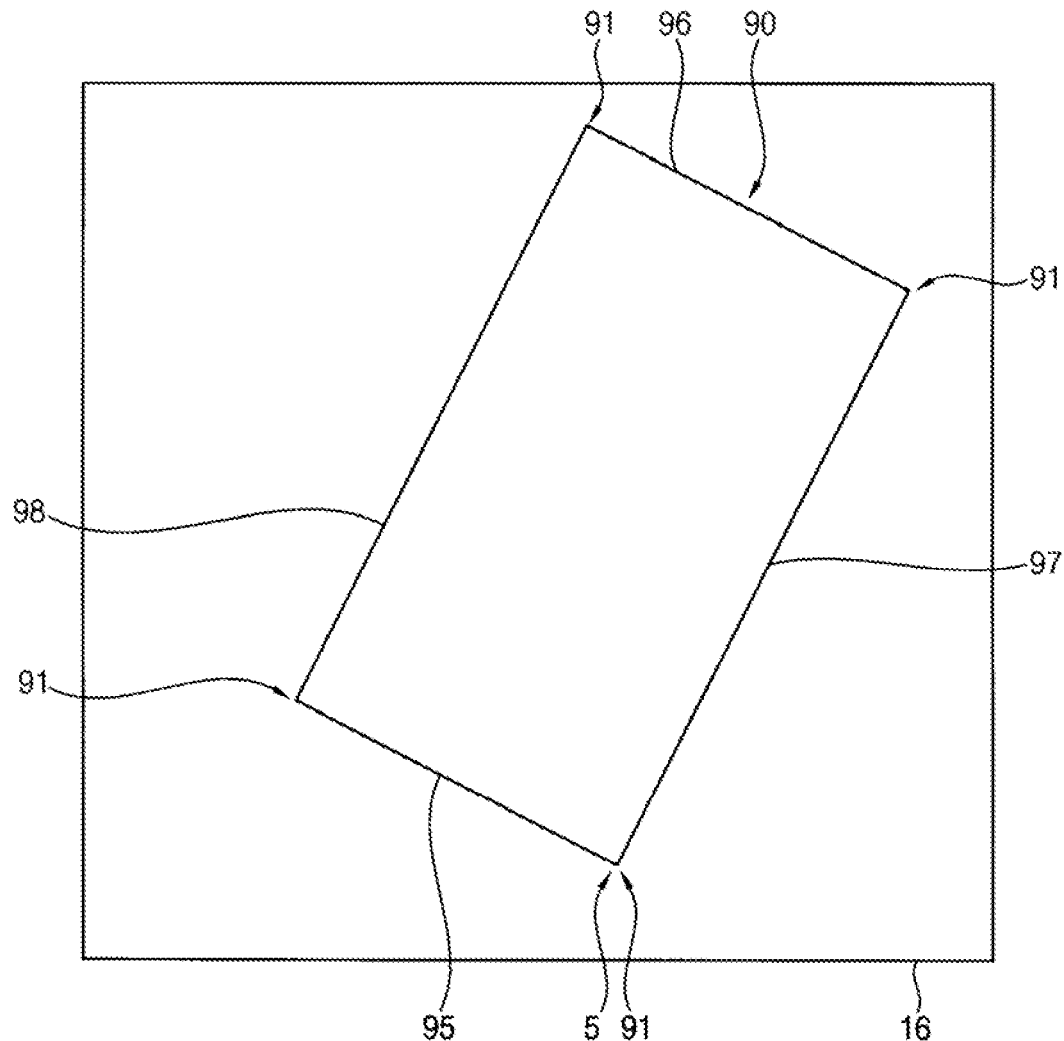
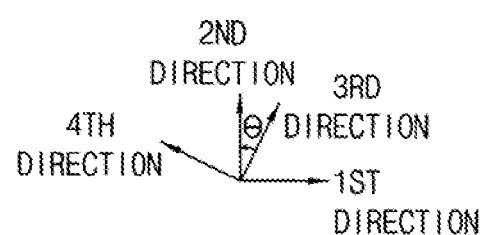

METHOD OF DESIGNING A LAYOUT OF A PATTERN, METHOD OF FORMING A PATTERN USING THE SAME, AND METHOD OF MANUFACTURING A SEMICONDUCTOR DEVICE USING THE SAME

CROSS-REFERENCE TO RELATED APPLICATION

Korean Patent Application No. 10-2019-0128844, filed on Oct. 17, 2019, in the Korean Intellectual Property Office, and entitled: "Method of Designing a Layout of a Pattern, Method of Forming a Pattern Using the Same, and Method of Manufacturing a Semiconductor Device Using the Same," is incorporated by reference herein in its entirety.

BACKGROUND

1. Field

Embodiments relate to a method of designing a layout of a pattern, a method of forming a pattern using the same, and a method of manufacturing a semiconductor device using the same.

2. Description of the Related Art

When a material pattern is formed on a material layer by a photolithography process using a reticle on which layouts of patterns are drawn, the material pattern may be formed to have a shape different from the layouts of patterns on the reticle. This is because the layouts of patterns may be deformed to be transferred due to the optical effects when the layouts of patterns are transferred onto a photoresist layer on the material layer by an exposure process using the reticle.

SUMMARY

Embodiments are directed to a method of designing a layout of a pattern, including rotating a layout of an original pattern designed on a mask by a rotational angle in a first rotational direction to form a layout of a rotation pattern, the mask including reference points, matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern, enlarging a region of the layout of the first modification pattern to form a layout of a second modification pattern, forming a layout of a reference pattern having the same direction as the layout of the rotation pattern, forming a layout of a target pattern based on a region in which the layout of the reference pattern and the layout of the second modification pattern overlap each other, performing an optical proximity correction on the layout of the target pattern to form a layout of a third modification pattern, and rotating the layout of the third modification pattern by the rotational angle in a second rotational direction to form a layout of a final pattern, the second rotational direction being opposite to the first rotation direction.

Embodiments are also directed to a method of designing a layout of a pattern, including rotating a layout of an original pattern designed on a mask by a rotational angle in a first rotational direction to form a layout of a rotation pattern, the mask including reference points arranged in a grid and a reference line extending in a first direction to pass through ones of the reference points, the layout of the original pattern having a shape of a polygon including edges meeting each other at vertices, each of the edges having an angle with respect to the reference line, the angle being not any of 0 degrees, 45 degrees, and 90 degrees, and the vertices overlapping ones of the reference points, respectively, matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern, enlarging a region of the layout of the first modification pattern to form a layout of a second modification pattern, forming a layout of a reference pattern having the same direction as the layout of the rotation pattern, forming a layout of a target pattern based on a region in which the layout of the reference pattern and the layout of the second modification pattern overlap each other, performing an optical proximity correction on the layout of the target pattern to form a layout of a third modification pattern, and rotating the layout of the third modification pattern by the rotational angle in a second rotational direction to form a layout of a final pattern, the second rotational direction being opposite to the first rotation direction.

Embodiments are also directed to a method of forming a pattern, including designing a layout of a final pattern on a mask, including: rotating a layout of an original pattern designed on the mask by a rotational angle in a first rotational direction to form a layout of a rotation pattern, the mask including reference points; matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern; enlarging a region of the layout of the first modification pattern to form a layout of a second modification pattern; forming a layout of a reference pattern having the same direction as the layout of the rotation pattern; forming a layout of a target pattern based on a region in which the layout of the reference pattern and the layout of the second modification pattern overlap each other; performing an optical proximity correction on the layout of the target pattern to form a layout of a third modification pattern; and rotating the layout of the third modification pattern by the rotational angle in a second rotational direction to form the layout of the final pattern, the second rotational direction being opposite to the first rotation direction; and forming the pattern on a substrate using the mask on which the layout of the final pattern is designed.

Embodiments are also directed to a method of manufacturing a semiconductor device, including designing a layout of a final pattern on a mask, including: rotating a layout of an original pattern designed on the mask by a rotational angle in a first rotational direction to form a layout of a rotation pattern, the mask including reference points; matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern; enlarging a region of the layout of the first modification pattern to form a layout of a second modification pattern; forming a layout of a reference pattern having the same direction as the layout of the rotation pattern; forming a layout of a target pattern based on a region in which the layout of the reference pattern and the layout of the second modification pattern overlap each other; performing an optical proximity correction on the layout of the target pattern to form a layout of a third modification pattern; and rotating the layout of the third modification pattern by the rotational angle in a second rotational direction to form the layout of the final pattern, the second rotational direction being opposite to the first rotation direction; forming an active pattern on a substrate using the mask on which the layout of the final pattern is designed, forming a gate structure at an upper portion of the active pattern, forming a bit line structure on a portion of the active pattern, forming a contact plug structure on a portion of the active pattern, and forming a capacitor on the contact plug structure.

BRIEF DESCRIPTION OF THE DRAWINGS

FIGS. 2 to 7 are plan views illustrating a method of forming a layout of a final pattern by modifying a layout of an original pattern.

FIGS. 8 and 9 are plan views illustrating a method of forming a pattern in accordance with an example embodiment.

DETAILED DESCRIPTION

Figure 1:
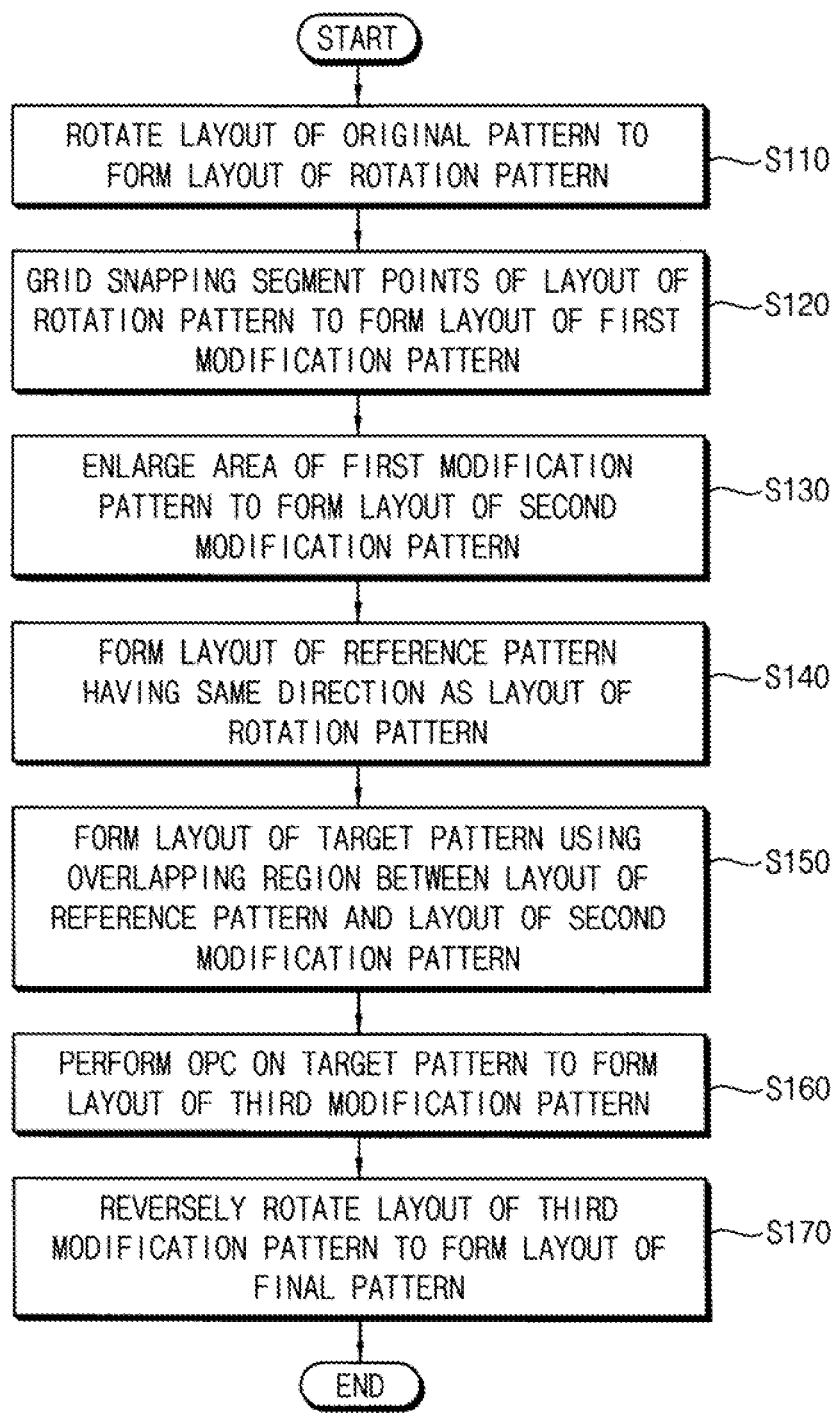
FIG. 1 is a flowchart illustrating a method of designing a layout of a pattern in accordance with an example embodiment.

FIG. 1 is a flowchart illustrating a method of designing a layout of a pattern in accordance with an example embodiment, and FIGS. 2 to 7 are plan views illustrating a method of forming a layout of a final pattern by modifying a layout of an original pattern.

Referring to FIGS. 1 and 2, in a first operation S110, a layout of an original pattern 20 designed on a mask 10 may be rotated by a rotational angle θ in a first rotational direction to form a layout of a rotation pattern 30.

The mask 10 may include reference points 2 arranged in a grid. An imaginary reference line 4 may be extended in a first direction to pass through some of the reference points 2. A second direction perpendicular to the first direction, a third direction having an acute angle with respect to the first or second direction, and a fourth direction perpendicular to the third direction may be defined with respect to the mask 10.

In an example embodiment, the layout of the original pattern 20 may have a shape of a polygon, and first vertices 21 at which first to fourth edges 25, 26, 27, and 28 of the polygon meet each other may overlap some of the reference points 2.

In an example embodiment, the polygon may be a rectangle including first and second edges 25 and 26 opposite to each other, each of which may extend in the fourth direction, and third and fourth edges 27 and 28 opposite to each other, each of which may extend in the third direction. A length of the rectangle in the third direction may be greater than a width of the rectangle in the fourth direction. Thus, the rectangle may extend in the third direction, and may be referred to as having a direction parallel to the third direction.

Each of the edges 25, 26, 27, and 28 of the rectangle may be divided into several segments by the first segment points 24. Ones of the first segment points 24 may overlap corresponding ones of the reference points 2, and other ones of the first segment points 24 may not overlap the reference points 2.

The layout of the original pattern 20 may be rotated in the first rotation direction about a reference vertex 5 among the first vertices 21 of the polygon through which the reference line 4 may pass to form the layout of the rotation pattern 30. The first rotation direction may be a clockwise or counterclockwise direction, and in the figure, the counter-clockwise direction is shown.

A sum of the rotational angle θ and an angle of one of the edges of the polygon with respect to the reference line 4 may be 90 degrees. Thus, a sum of the rotational angle θ and an angle of the third edge 27 of the rectangle with respect to the reference line 4 may be 90 degrees. In an example embodiment, at least one of the edges of the polygon may have an angle with respect to the reference line 4 that is not one of 0 degrees, 45 degrees, and 90 degrees. In the rectangle, each of the edges may have an angle with respect to the reference line 4 that is not one of 0 degrees, 45 degrees, and 90 degrees.

The layout of the rotation pattern 30 may have the same shape of the polygon as the layout of the original pattern 20, however, the direction of the polygon may be changed. Thus, if the layout of the original pattern 20 is the shape of the rectangle having the third direction, the layout of the rotation pattern 30, which may be formed by rotating the original pattern 20 by the rotational angle θ in the first rotational angle, may be a shape of a rectangle having the second direction, and a length in the second direction may be greater than a width in the first direction. The rectangle may have fifth to sixth edges 35 and 36 opposite to each other, each of which may extend in the first direction, and seventh and eight edges 37 and 38 opposite to each other, each of which may extend in the second direction, and may include second vertices 31 at which the fifth to eighth edges 35, 36, 37, and 38 may meet each other.

In the rectangle of the layout of the rotation pattern 30, each of the fifth to eighth edges 35, 36, 37, and 38 may be divided into several segments by second and third segment points 33 and 34. The second segment points 33 may overlap corresponding ones of the reference points 2, and the third segment points 34 may not overlap the reference points 2. Additionally, ones of the second vertices 31 of the rectangle may not overlap the reference points 2. However, the reference vertex 5 of the rotation pattern 30 may be the same as the reference vertex 5 of the original pattern 20, and thus may overlap the reference point 2. Each of the fifth and seventh edges 35 and 37 meeting each other at the reference vertex 5 may have an angle of 0 degrees or 90 degrees with respect to the reference line 4.

Figure 3:
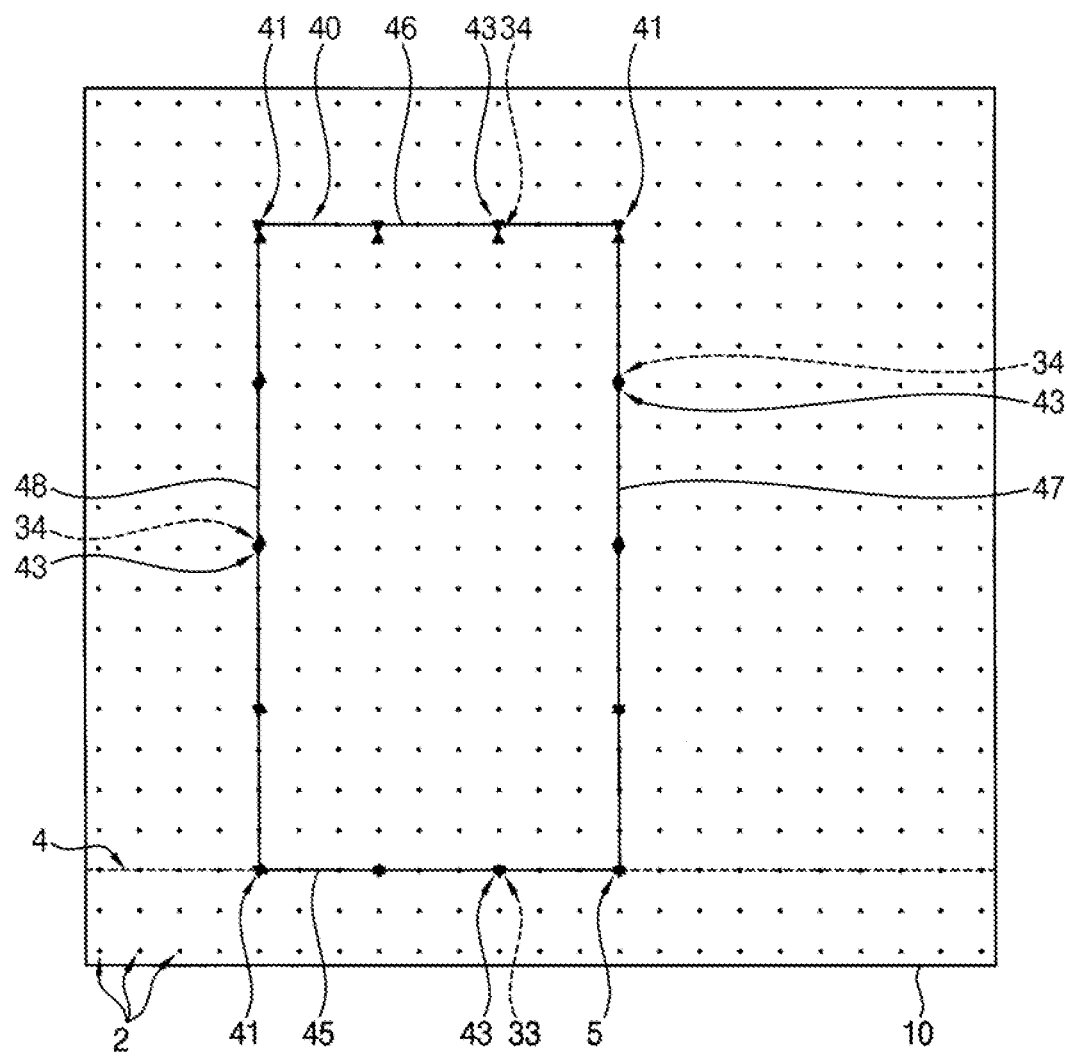

Referring to FIGS. 1 and 3, in a second operation S120, each of the second vertices 31 and the second and third segment points 33 and 34 of the layout of the rotation pattern 30 may be matched with closest one of the reference points 2, and the matched reference points 2 may be connected with each other to form a layout of a first modification pattern 40.

The operation of matching each of the second vertices 31 and the second and third segment points 33 and 34 of the layout of the rotation pattern 30 with the closest one of the reference points 2 may be referred to as a grid snapping, and thus third vertices 41 and fourth segment points 43 overlapping the reference points 2 may be formed.

As illustrated above, the second segment points 33 of the layout of the rotation pattern 30 may overlap the corresponding ones of the reference points 2, respectively, and thus an additional matching operation is not needed, however, the third segment points 34 may not overlap the reference points 2, and thus the additional matching operation in which respective ones closest to the third segment points 34 may be matched therewith may be performed. Additionally, ones of the second vertices 31 of the layout of the rotation pattern 30 may not overlap the reference points 2, and in this case, the additional matching operation may be performed.

In the figures, the third vertices 41 and the fourth segment points 43 that may be formed by the grid snapping are shown by an inverted triangle in comparison with the second vertices 31 and the second and third segment points 33 and 34 shown with a triangle.

The third vertices 41 and the fourth segment points 43 may be connected with each other to form the layout of the first modification pattern 40. In the figure, the layout of the first modification pattern 40 has a shape of a rectangle having the second direction in which the reference vertex 5 is one of vertices of the rectangle. The rectangle may have ninth and tenth edges 45 and 46 opposite to each other, each of which may extend in the first direction, and eleventh and twelfth edges 47 and 48 opposite to each other, each of which may extend in the second direction.

In an example embodiment, a length in the second direction of the first modification pattern 40 may be greater than the length in the second direction of the rotation pattern 30, and a width in the first direction of the first modification pattern 40 may be less than the width in the first direction of the rotation pattern 30.

Figure 4:
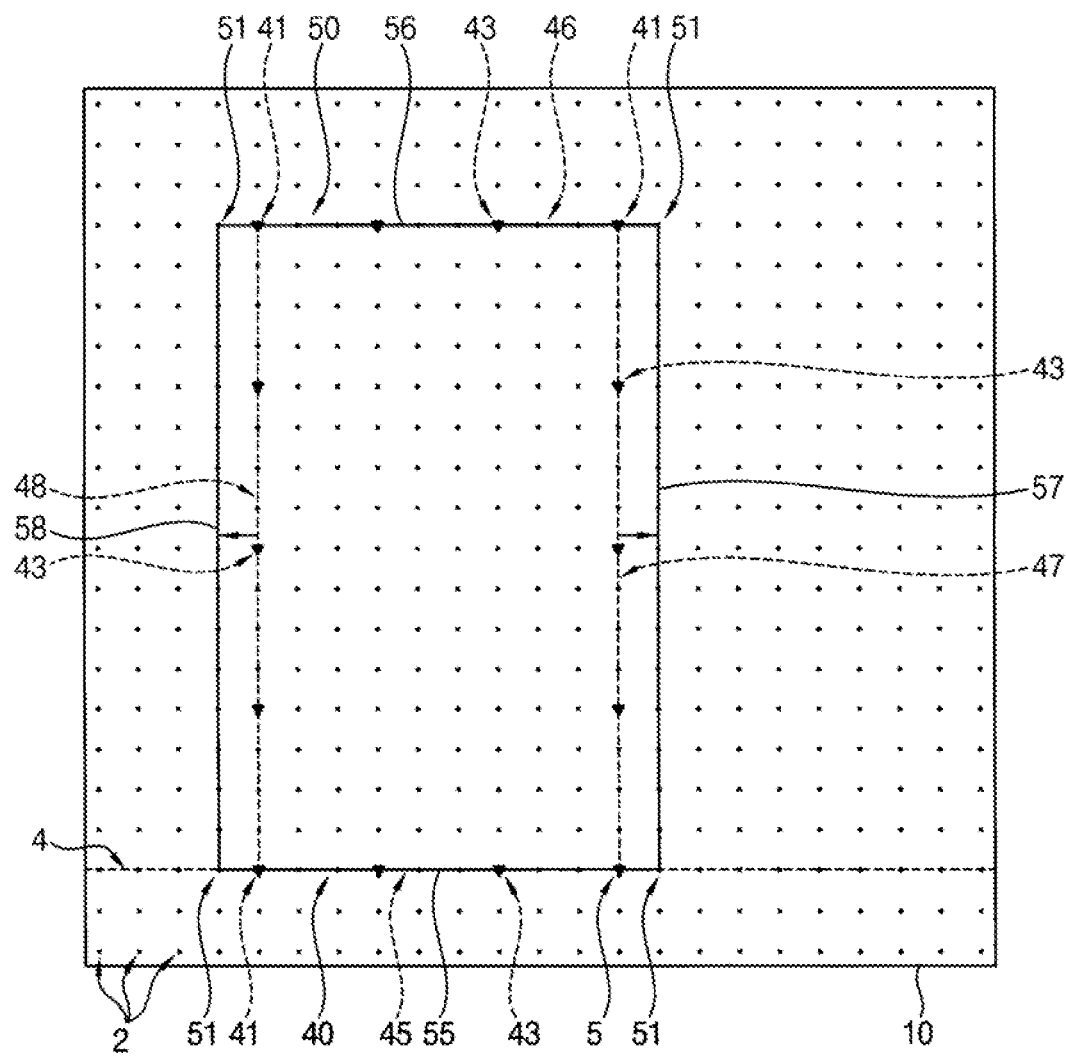

Referring to FIGS. 1 and 4, in a third operation S130, a region of the layout of the first modification pattern 40 may be enlarged to form a layout of a second modification pattern 50. Thus, a plus bias may be given to the layout of the first modification pattern 40.

In an example embodiment, the width in the first direction of the layout of the first modification pattern 40 may be enlarged so that the region thereof may be enlarged. Thus, lengths of the ninth and tenth edges 45 and 46 of the rectangle, each of which may extend in the first direction, may be elongated in the first direction along opposite directions to form thirteenth and fourteenth edges 55 and 56, respectively, and the eleventh and twelfth edges 55 and 56, each of which may extend in the second direction, may be moved in the first direction to form fifteenth and sixteenth edges 57 and 58, respectively, that may meet ends of the thirteenth and fourteenth edges 55 and 56. Thus, the layout of the second modification pattern 50 having a shape of rectangle including the thirteenth to sixteenth edges 55, 56, 57, and 58 with a region greater than that of the first modification pattern 50 may be formed. The thirteenth to sixteenth edges 55, 56, 57, and 58 may meet each other at fourth vertices 51.

In another implementation, the region of the layout of the first modification pattern 40 may be enlarged, e.g., in the second direction to form the layout of the second modification pattern 50.

Figure 5:
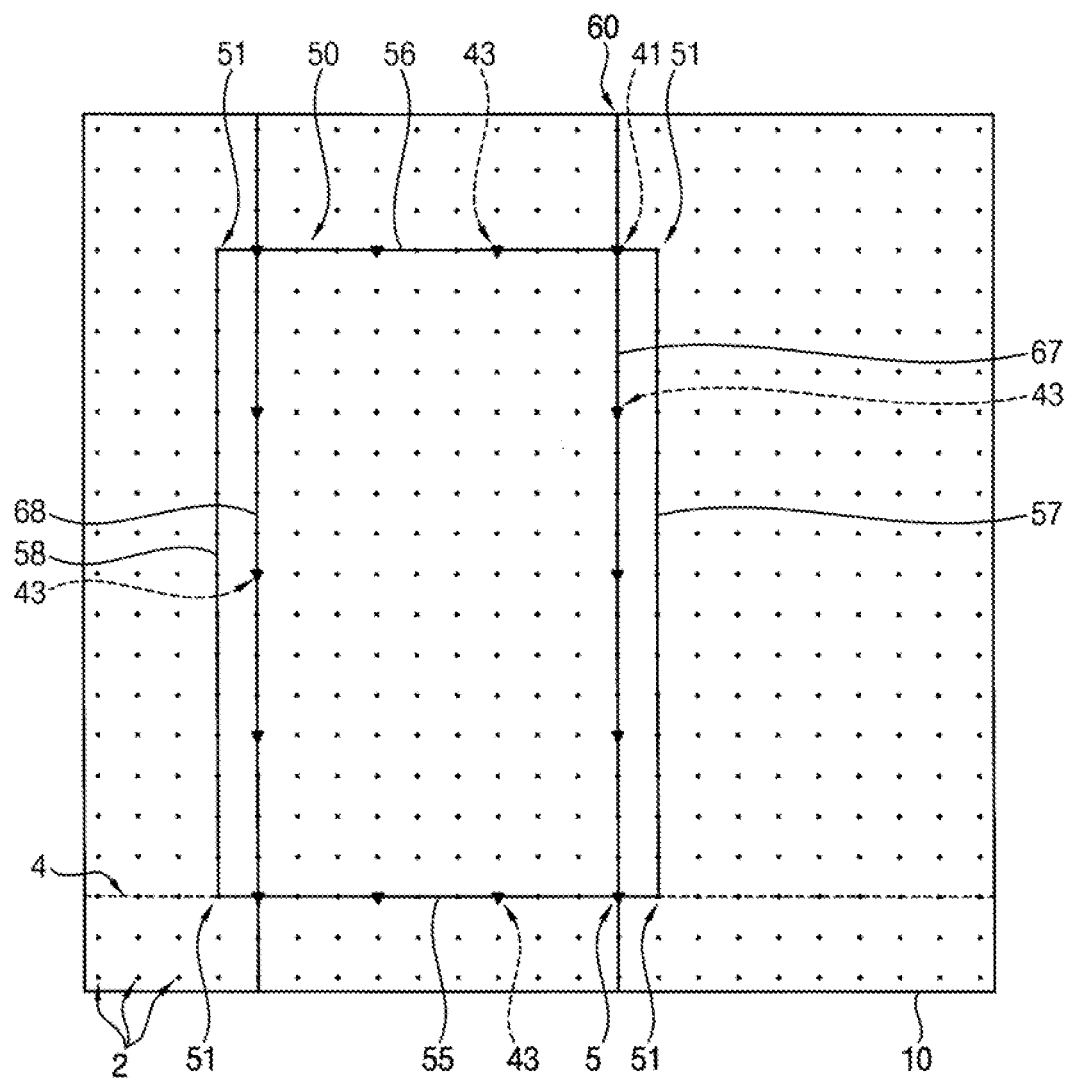

Referring to FIGS. 1 and 5, in a fourth operation S140, a layout of a reference pattern 60 having the same direction as the layout of the rotation pattern 30 may be formed.

In an example embodiment, the layout of the reference pattern 60 may include a first line 67 extending in the second direction to pass through the reference vertex 5 of the layout of the original pattern 20 and a second line 68 extending in the second direction to pass through the reference points 2 and being spaced apart from the first line 67 in the first direction by a distance close to the width in the fourth direction of the layout of the original pattern 20.

In an example embodiment, the first and second lines 67 and 68 of the layout of the reference pattern 60 may correspond to ones elongated in the second direction from the eleventh and twelfth edges 47 and 48 of the layout of the first modification pattern 40.

Referring to FIGS. 1 and 6, in a fifth operation S150, a layout of a target pattern 70 may be formed based on a region in which the layout of the reference pattern 60 and the second modification pattern 50 overlap each other.

Thus, the target pattern 70 may be formed using logical AND among the Boolean operators on the layout of the reference pattern 60 and the second modification pattern 50.

In an example embodiment, the layout of the target pattern 70 may have a shape of a rectangle including portions of the first and second lines 67 and 68 of the layout of the reference pattern 60 between the thirteenth and fourteenth edges 55 and 56 of the layout of the second modification pattern 50, and portions of the thirteenth and fourteenth edges 55 and 56 of the layout of the second modification pattern 50 between the first and second lines 67 and 68 of the layout of the reference pattern 60.

Thus, the layout of the target pattern 70 may have a shape of a rectangle including a seventeenth edge 75 extending in the first direction from the reference vertex 5, an eighteenth edge 76 extending in the first direction to face the seventeenth edge 75, a nineteenth edge 77 extending in the second direction from the reference vertex 5, and a twentieth edge 78 extending in the second direction to face the nineteenth edge 77, which may meet each other at fifth vertices 71.

The layout of the target pattern 70 may include fifth segment points 73 dividing each of the seventeenth to twentieth edges 75, 76, 77, and 78 into a plurality of segments. In an example embodiment, the fifth segment points 73 may overlap the fourth segment points 43, respectively.

In a sixth operation S160, an optical proximity correction (OPC) may be performed on the layout of the target pattern 70 to form a layout of a third modification pattern.

In an example embodiment, the OPC may be performed based on data about the fifth vertices 71 and the fifth segment points 73 included in the layout of the target pattern 70. The data for performing the OPC may be stored in a database by unit of the reference point 2 included in the mask 10, and the fifth vertices 71 and the fifth segment points 73 may overlap the reference points 2 so that the OPC may be performed based on the data about the fifth vertices 71 and the fifth segment points 73.

In an example embodiment, the OPC may include corner rounding correction. For example, each of corners of the rectangle of the layout of the target pattern 70, that is, a portion of each of the seventeenth to twentieth edges 75, 76, 77, and 78 close to the fifth vertices 71 may be expanded outwardly, so that the layout of the third modification pattern may have a shape of a rectangle having outwardly expanded first corners 79.

Referring to FIG. 7, in a seventh operation S170, the layout of the third modification pattern may be rotated by the rotational angle θ in a second rotational direction, which may be opposite to the first rotational direction, to form a layout of a final pattern 80.

In an example embodiment, the layout of the third modification pattern may be rotated in the second rotation direction about the reference vertex 5, and in the figure, the clockwise direction is shown. The layout of the final pattern 80 may have the same shape as the third modification pattern, but may have different direction. Thus, the layout of the final pattern 80 may have a shape of a rectangle with outwardly expanded second corners 89, and the rectangle may have the third direction.

By the above operations, the OPC may be performed on the layout of the original pattern 20 to form the layout of the final pattern 80. Thus, the layout of the original pattern 20 may include the first to fourth edges 25, 26, 27, and 28 having angles with respect to the reference line 4 of the mask 10, which may not be any of 0 degrees, 45 degrees, and 90 degrees, and thus at least one of the first segment points 24 dividing each of the first to fourth edges 25, 26, 27, and 28 into a plurality of segments may not overlap the reference points 2 of the mask 10. Thus, data stored at the reference points 2 for performing an OPC may not be used, so that the OPC cannot be automatically performed using computer programs and that the layout of the original pattern 20 has to be segmented manually and optimum bias has to be found by simulation.

However, in example embodiments, even though each of the first to fourth edges 25, 26, 27, and 28 of the layout of the original pattern 20 has an angle with respect to the reference line 4 that may not be one of 0 degrees, 45 degrees, and 90 degrees, each of the fifth to eighth edges 35, 36, 37, and 38 of the layout of the rotation pattern 30, which may be formed by rotating the layout of the original pattern 20 about the reference vertex 5, may have an angle of 0 degrees or 90 degrees with respect to the reference line 4, and the third vertices 41 and the fourth segment points 43 of the layout of the first modification pattern 40 formed by grid snapping may overlap the reference points 2, so that the data stored at the reference points 2 may be used and that the OPC may be automatically performed using computer programs by a computer processor.

Additionally, the plus bias may be given to the layout of the first modification pattern 40 to form the layout of the second modification pattern 50, the layout of the reference pattern 60 having a size similar to that of the layout of the original pattern 20 and including the first and second lines 67 and 68 passing through the reference points 2, and the logical AND operator may be applied to the second modification pattern 50 and the reference pattern 60, so that the layout of the target pattern 70 very similar to the layout of the original pattern 20, which may include the fifth vertices 71 and the fifth segment points 73 overlapping the reference points 2 from which the data for the OPC may be used, may be formed.

Above, one pattern designed on the mask 10 has been described, but embodiments may also be applied to a plurality of patterns designed on the mask 10. For example, when layouts of a plurality of original patterns 20 are designed to be spaced apart from each other by a given distance in the first direction on the mask 10, layout of a plurality of rotation patterns 30, layout of a plurality of first modification patterns 40 and a plurality of second modification patterns 50, layout of a plurality of third modification patterns, layouts of a plurality of reference patterns 60, layouts of a plurality of target patterns 70, and layouts of a plurality of final patterns 80 may be formed correspondingly.

In an example embodiment, the layouts of the reference patterns 60 may be formed correspondingly to the layouts of the second modification patterns 50 to be spaced apart from each other by a given distance in the first direction.

Figure 9:
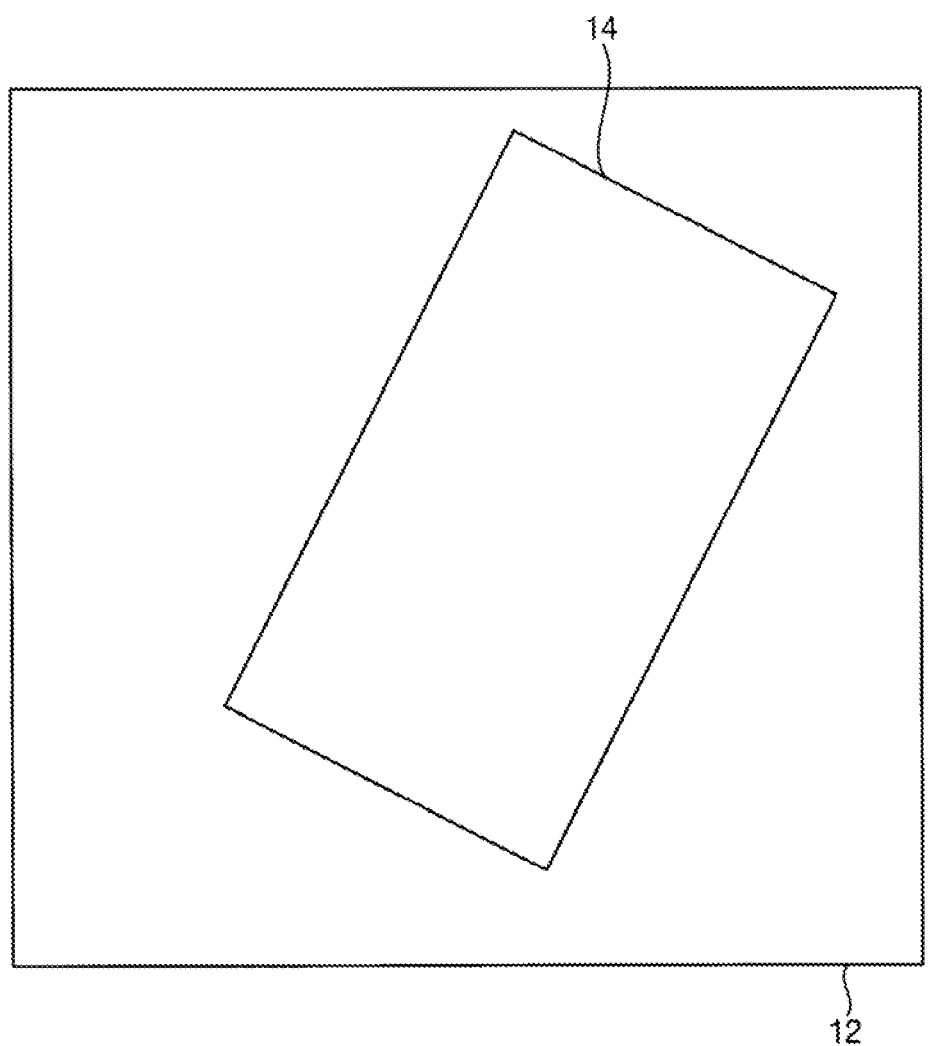

FIGS. 8 and 9 are plan views illustrating a method of forming a pattern in accordance with an example embodiment. This method may be performed using the method of designing the layout of the pattern, and thus repetitive explanation may be omitted herein.

Referring to FIGS. 7 and 8, an exposure process may be performed using the mask 10 on which the layout of the final pattern 80 is designed on a substrate 12 (refer to FIG. 9) having an etching object layer and a photoresist layer 16 are sequentially stacked thereon.

The layout of the final pattern 80 designed on the mask 10 may be transferred to the photoresist layer 16, however, the second corners 89 expanded by the OPC may be reduced. Thus, a layout of a transfer pattern 90, which may be very similar to the layout of the original pattern 20 (refer to FIG. 2), may be formed on the photoresist layer 16.

The layout of the transfer pattern 90 may have a shape of a rectangle having the third direction, and the rectangle may include twenty-first and twenty-second edges 95 and 96, each of which may extend in the fourth direction, opposite to each other and twenty-third and twenty-fourth edges 97 and 98, each of which may extend in the third direction, opposite to each other. The rectangle may further include sixth vertices 91 at which the twenty-first to twenty-fourth edges 95, 96, 97 and 98 meet each other.

Referring to FIG. 9, a developing process may be performed on the photoresist layer 16 to form a photoresist pattern (not shown) having a shape substantially the same as the layout of the transfer pattern 90.

The etching object layer may be etched using the photoresist pattern as an etching mask to form a pattern 14 having a desired shape on the substrate 12, and the photoresist pattern may be removed by, e.g., an ashing process and/or a stripping process.

In another implementation, an etching mask layer (not shown) may be further formed between the etching object layer and the photoresist layer 16 on the substrate 12, the etching mask layer may be etched using the photoresist pattern to form an etching mask, and the etching object layer may be etched using the etching mask to form the pattern 14.

As illustrated above, the pattern 14 having a shape very similar to the layout of the original pattern 20, which may be formed from the layout of the final pattern 80 by the method with reference to FIGS. 1 to 7, may be formed.

FIGS. 10 to 29 are plan views and cross-sectional views illustrating a semiconductor device in accordance with an example embodiment. FIGS. 10, 11, 13, 15, 18, 22 and 28 are the plan views, and FIGS. 12, 14, 16, 17, 19-21, 23-27 and 29 are the cross-sectional views. FIGS. 13, 15, 18, 22 and 28 are enlarged plan views of a region X of FIG. 11, and FIGS. 12, 14, 16, 17, 19-21, 23-27 and 29 includes cross-sections taken along lines A-A' and B-B' of corresponding plan views, respectively.

This method may be performed using the method of designing the layout of the pattern described with reference to FIGS. 1 to 7 and the method of forming the pattern described with reference to FIGS. 8 and 9, and thus repetitive explanation may be omitted herein.

Hereinafter, two directions substantially parallel to an upper surface of a substrate 100 and substantially perpendicular to each other may be referred as first and second directions, respectively, and a direction substantially parallel to the upper surface of the substrate 100 and having an acute angle except for 45 degrees with respect to each of the first and second directions may be referred to as a third direction.

Figure 10:
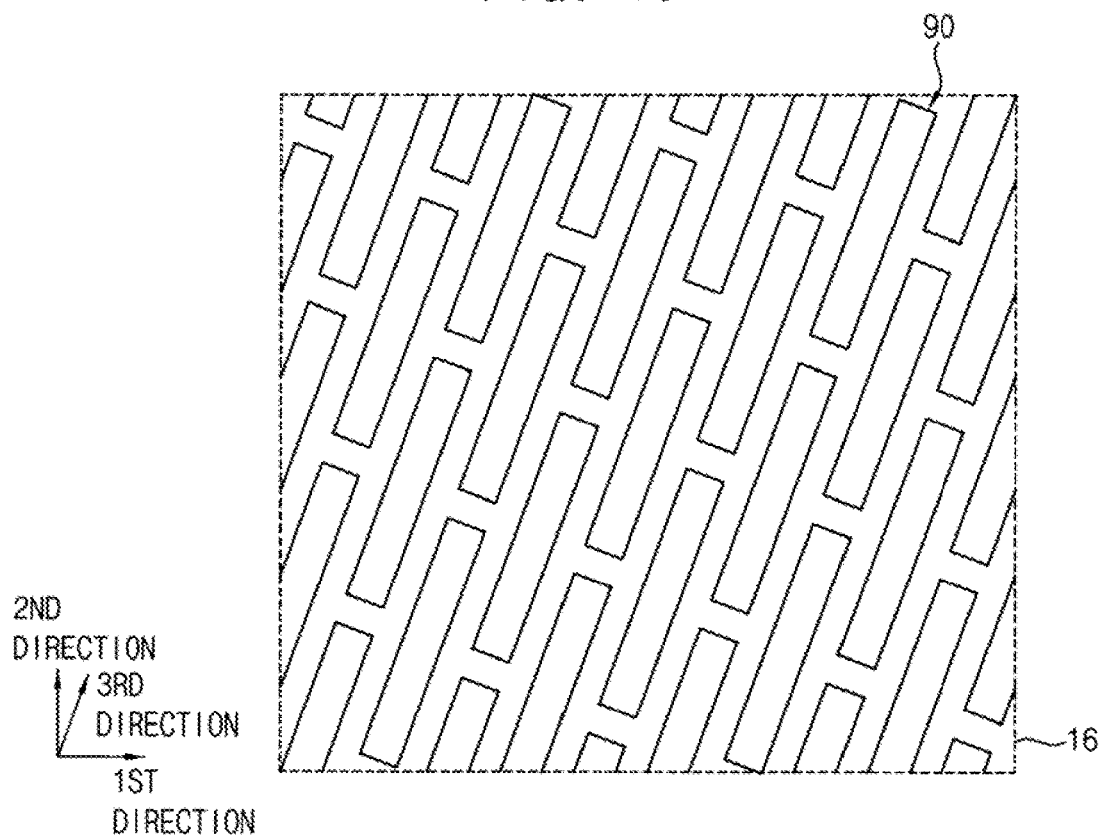
FIGS. 10 to 29 are plan views and cross-sectional views illustrating a semiconductor device in accordance with an example embodiment.

Referring to FIG. 10, processes substantially the same as or similar to those described with reference to FIGS. 1 to 8 may be performed.

Thus, the photoresist layer 16 may be formed on the substrate 100 (refer to FIGS. 11 and 12), and an exposure process may be performed on the photoresist layer 16 using the mask 10 on which the layout of the final pattern 80 is designed, so that the layout of the transfer pattern 90 very similar to the layout of the original pattern 20 (refer to FIG. 2) may be formed on the photoresist layer 16. For example, layouts of a plurality of transfer patterns 90 spaced apart from each other in each of the third direction and a direction substantially perpendicular to the third direction may be formed on the photoresist layer 16.

In an example embodiment, the layout of each of the transfer patterns 90 may have a shape of a rectangle having the third direction.

The substrate 100 may include a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Figure 11:
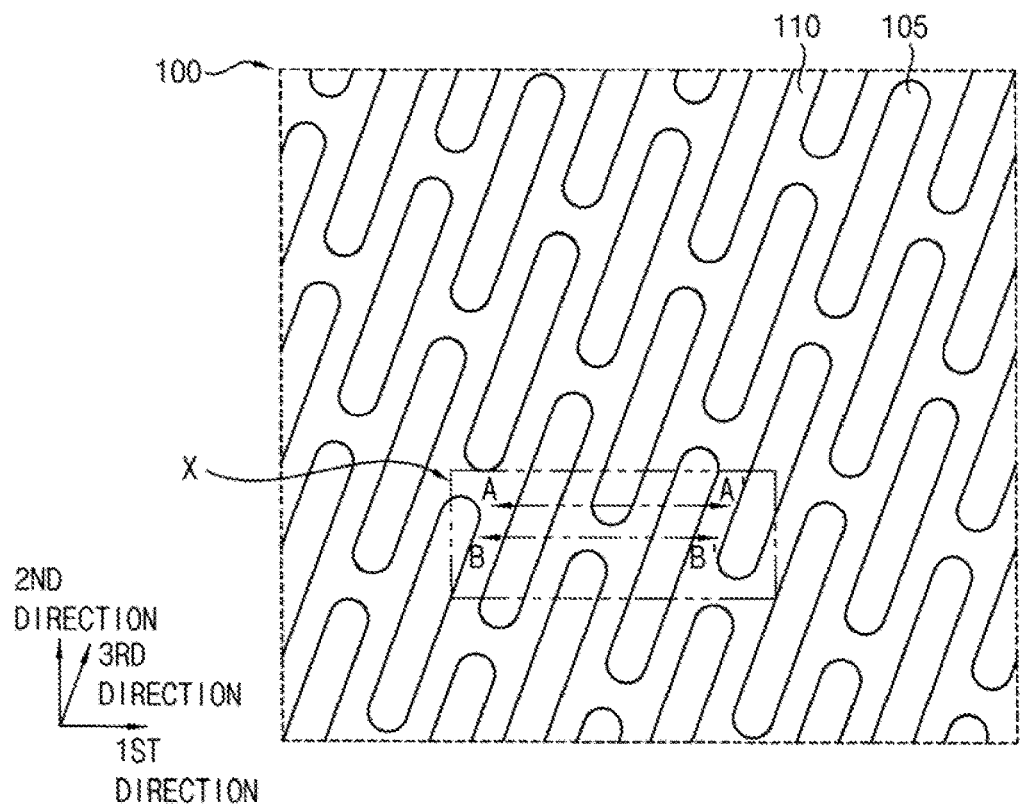
Figure 12:
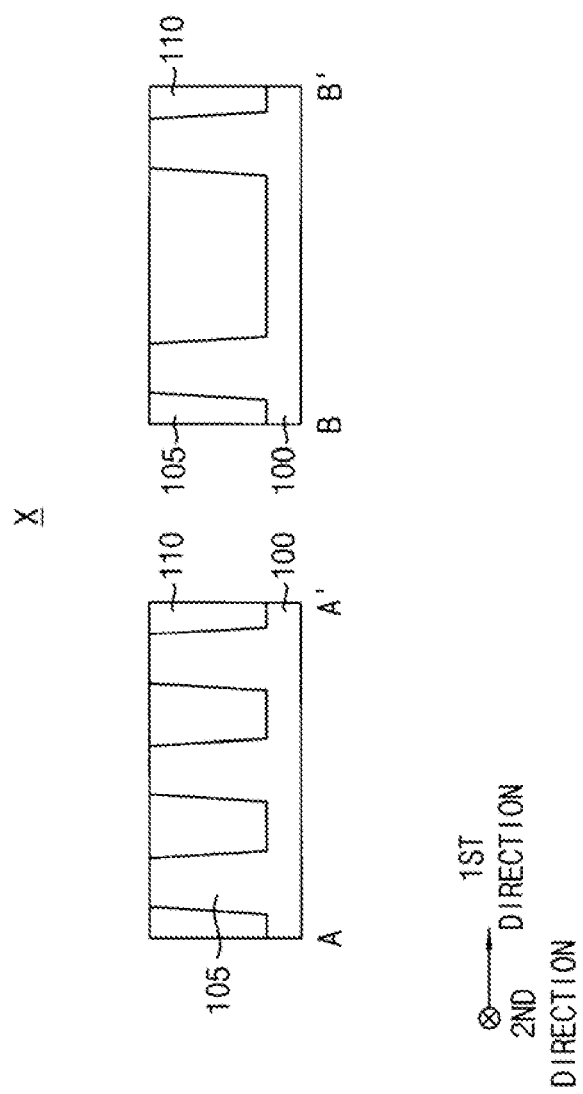

Referring to FIG. 11, a developing process may be performed on the photoresist layer 16 to form photoresist patterns (not shown) each of which may have a shape substantially the same as the layout of one of the transfer patterns 90, and an upper portion of the substrate 100 may be etched using the photoresist patterns as an etching mask to form active patterns 105.

In an example embodiment, each of the active patterns 105 may have a shape of a rectangle similar to the layout of each of the transfer patterns 90. However, due to the characteristics of the etching process, end portions of the rectangle in the third direction may be rounded.

An isolation pattern 110 may be formed on the substrate 100 to cover sidewalls of the active patterns 105.

Figure 13:
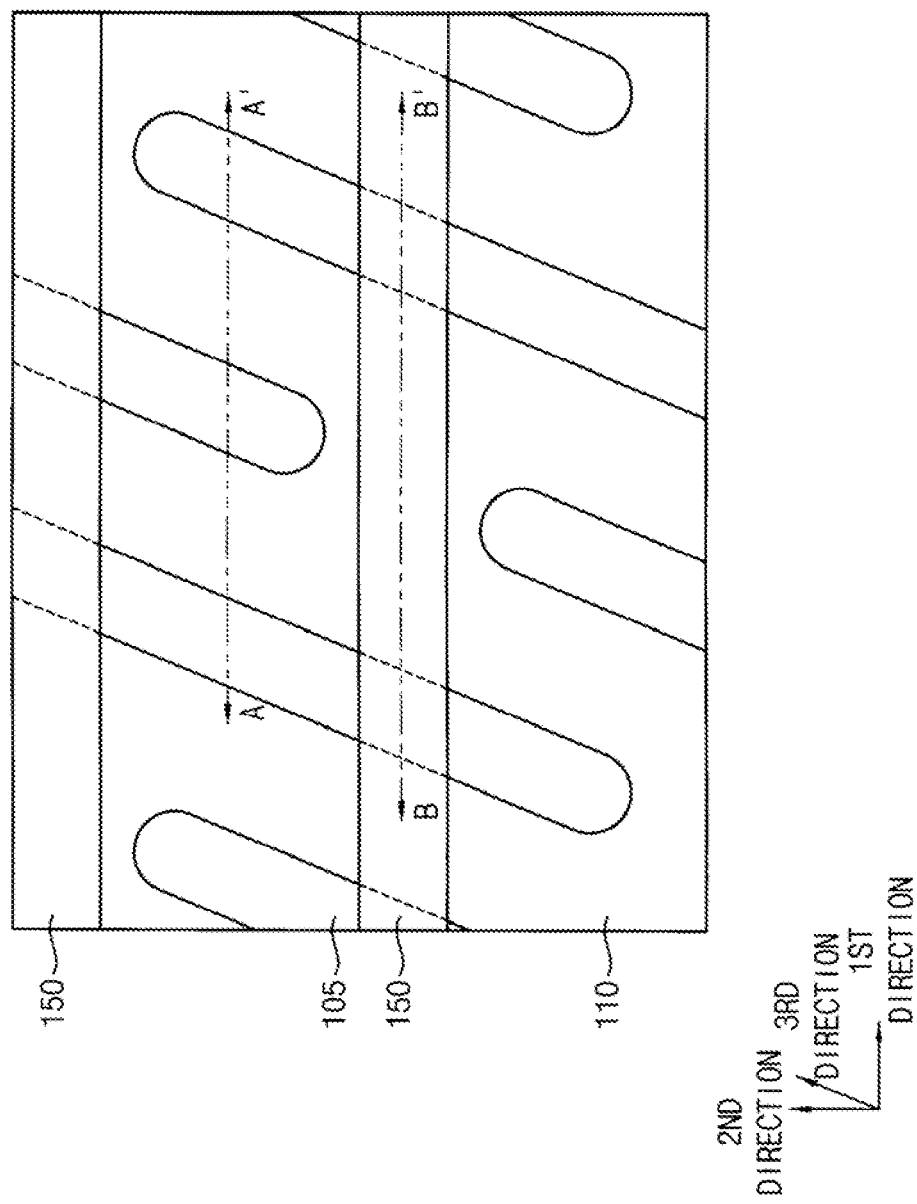
Figure 14:
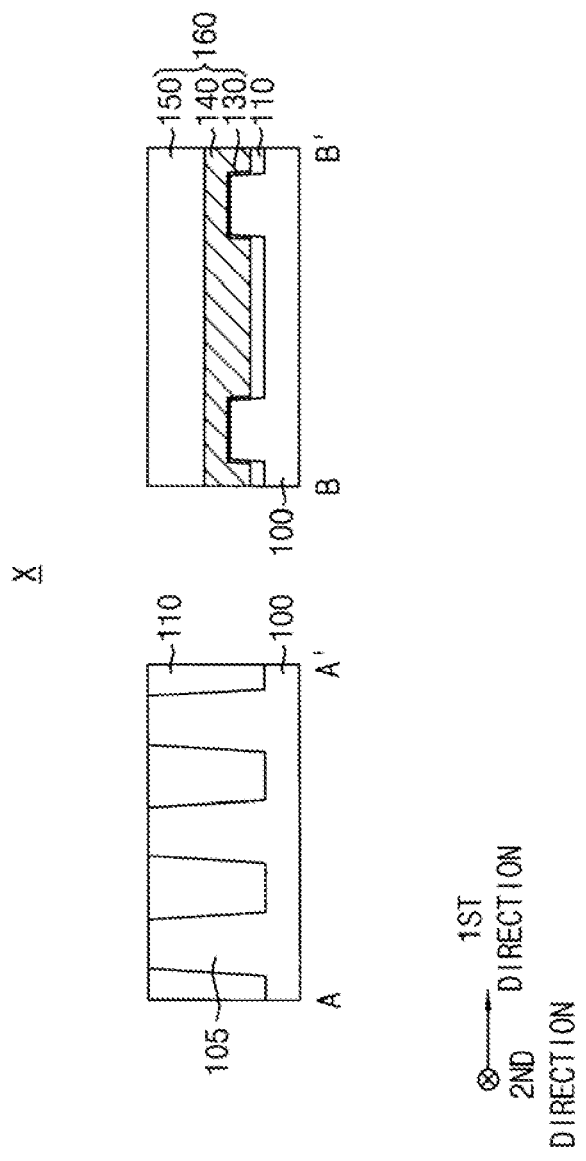

Referring to FIGS. 13 and 14, an ion implantation process may be performed onto the substrate 100 to form an impurity region (not shown), and the active pattern 105 and the isolation pattern 110 may be partially etched to form a first recess extending in the first direction.

A gate structure 160 may be formed in the first recess. The gate structure 160 may include a gate insulation layer 130 on a surface of the active pattern 105 exposed by the first recess, a gate electrode 140 filling a lower portion of the first recess on the gate insulation layer 130, and a gate mask 150 filling an upper portion of the first recess on the gate electrode 140. The gate structure 160 may extend in the first direction, and a plurality of gate structures 160 may be formed in the second direction.

In an example embodiment, the gate insulation layer 130 may be formed by a thermal oxidation process on the surface of the active pattern 105 exposed by the first recess, and thus may include an oxide, e.g., silicon oxide.

Figure 15:
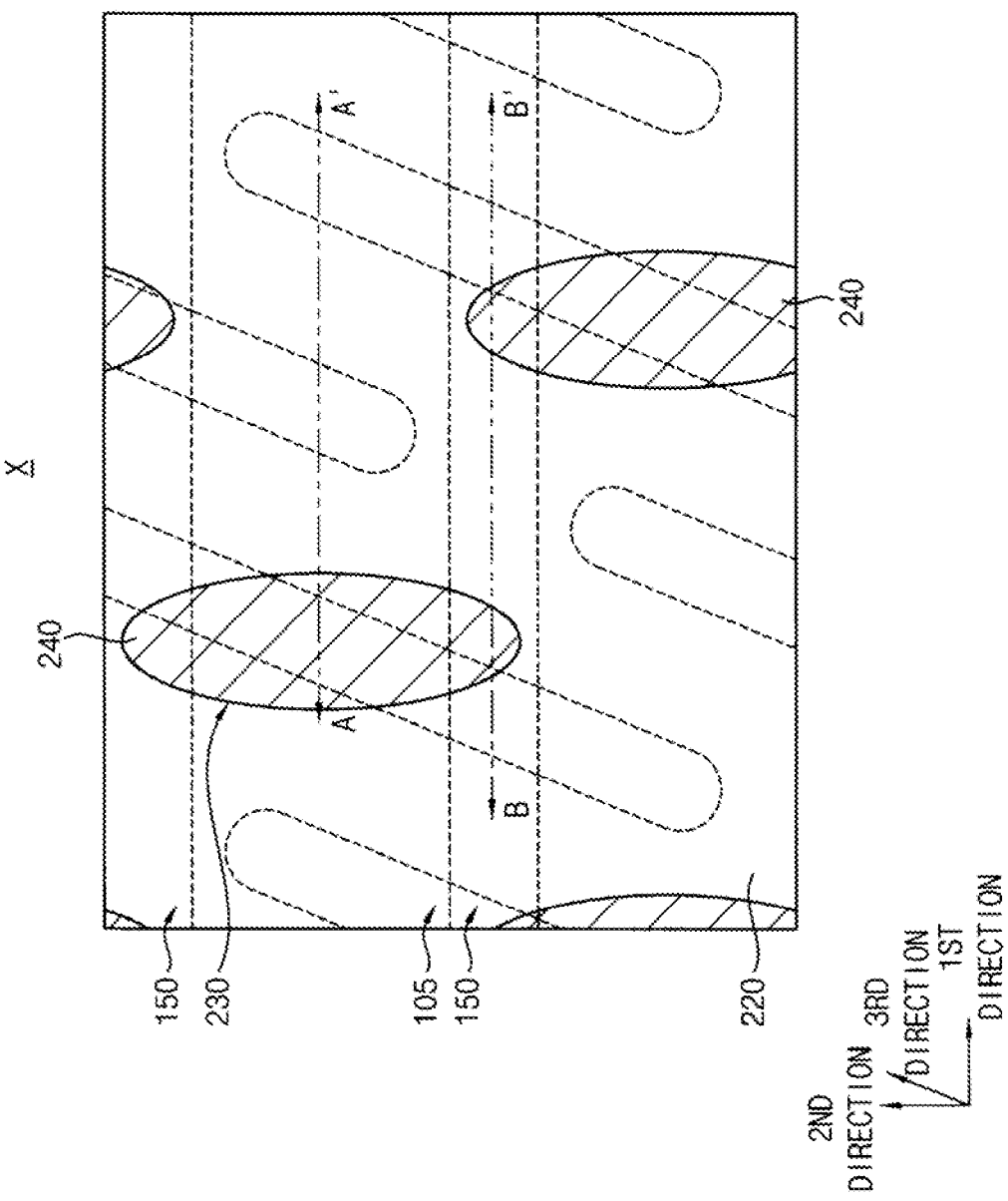
Figure 16:
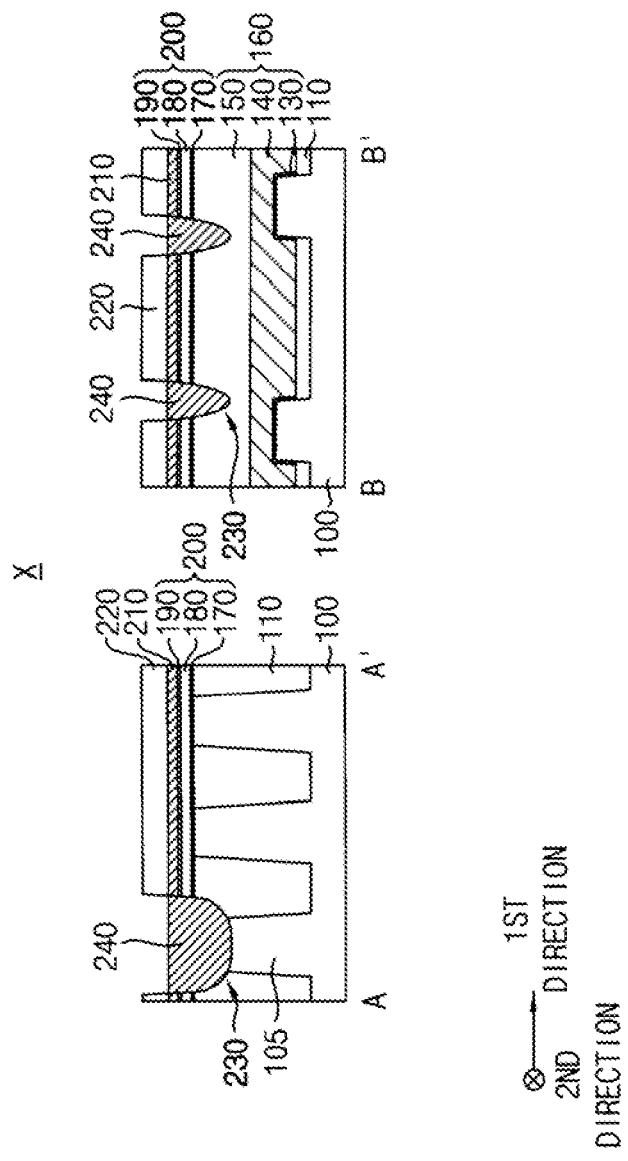

Referring to FIGS. 15 and 16, an insulation layer structure 200 may be formed on the active patterns 105 and the isolation pattern 110.

In an example embodiment, the insulation layer structure 200 may include first, second and third insulation layers 170, 180 and 190 sequentially stacked. Each of the first and third insulation layers 170 and 190 may include an oxide, e.g., silicon oxide, and the second insulation layer 180 may include a nitride, e.g., silicon nitride.

A first conductive layer 210 and a first mask 220 may be sequentially formed on the insulation layer structure 200, and the first conductive layer 210 and the insulation layer structure 200 may be etched using the first mask 220 as an etching mask to form a first opening 230 exposing the active pattern 105.

The first conductive layer 210 may include, e.g., doped polysilicon, and the first mask 220 may include a nitride, e.g., silicon nitride.

During the etching process, an upper portion of the active pattern 105 exposed by the first opening 230 and an upper portion of the isolation pattern 110 adjacent thereto, and an upper portion of the gate mask 150 may be also etched to form a second recess. Thus, a bottom of the first opening 230 may be referred to as the second recess.

In an example embodiment, the first opening 230 may expose a central upper surface of each of the active patterns 105 extending in the third direction, and thus a plurality of first openings 230 may be formed in each of the first and second directions.

A second conductive layer 240 may be formed to fill the first opening 230.

In an example embodiment, the second conductive layer 240 may be formed by forming a preliminary second conductive layer on the active pattern 105, the isolation pattern 110, the gate mask 150, and the first mask 220 to fill the first opening 230, and removing an upper portion of the preliminary second conductive layer by a CMP process and/or an etch back process. The second conductive layer 240 may be formed to have an upper surface substantially coplanar with an upper surface of the first conductive layer 210.

In an example embodiment, a plurality of second conductive layers 240 may be formed to be spaced apart from each other in each of the first and second directions. The second conductive layer 240 may include, e.g., doped polysilicon, and thus may be merged with the first conductive layer 210.

Figure 17:
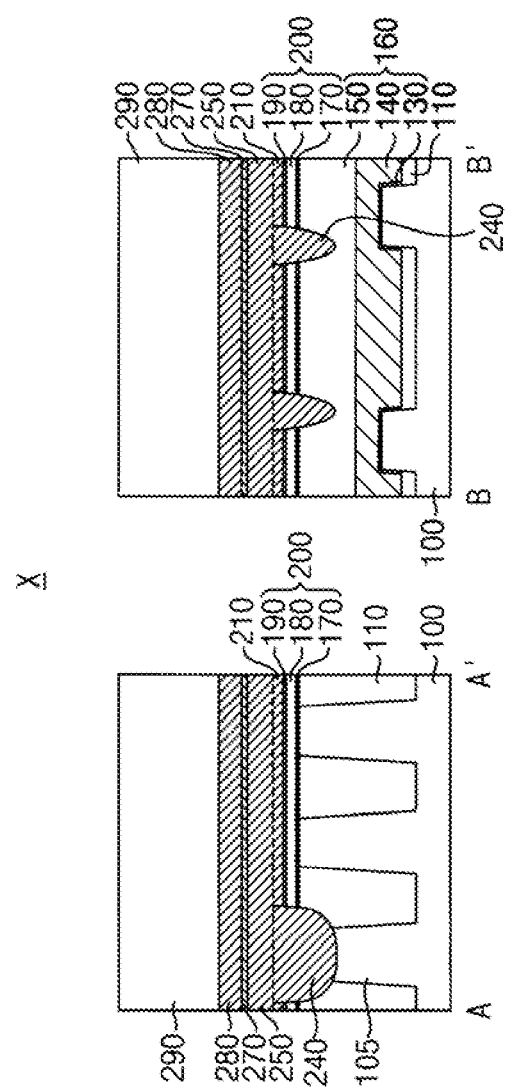

Referring to FIG. 17, after removing the first mask 220, a third conductive layer 250, a barrier layer 270, and a first metal layer 280 may be sequentially formed on the first and second conductive layers 210 and 240.

In an example embodiment, the third conductive layer 250 may include a material substantially the same as that of the first and second conductive layers 210 and 240. Thus, the third conductive layer 250 may include doped polysilicon, and thus may be merged with the first and second conductive layers 210 and 240. The barrier layer 270 may include a metal nitride, e.g., titanium nitride, tantalum nitride, tungsten nitride, etc. The first metal layer 280 may include a metal, e.g., tungsten, titanium, tantalum, etc.

A capping layer 290 may be formed on the first metal layer 280. The capping layer 290 may include a nitride, e.g., silicon nitride.

Figure 18:
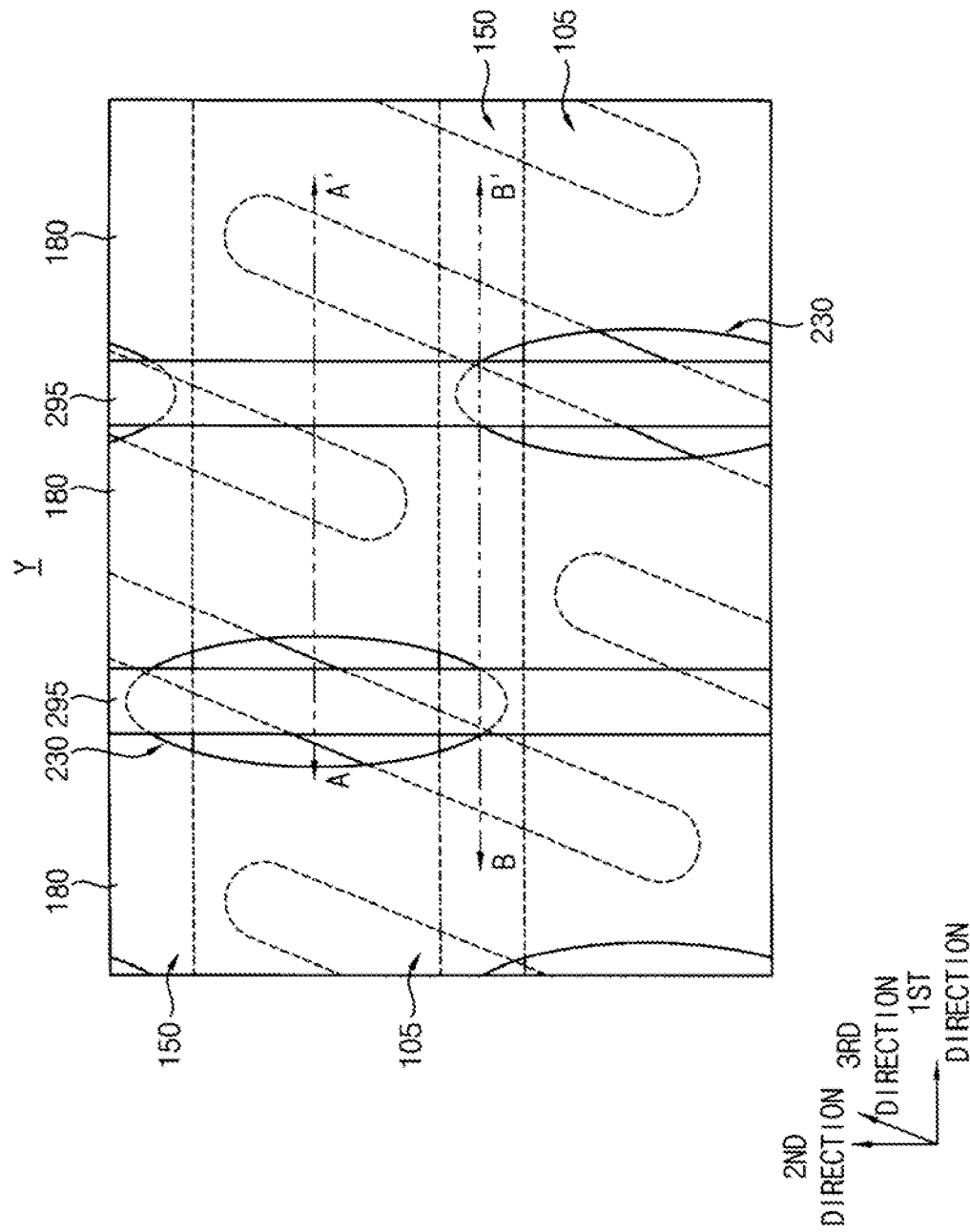
Figure 19:
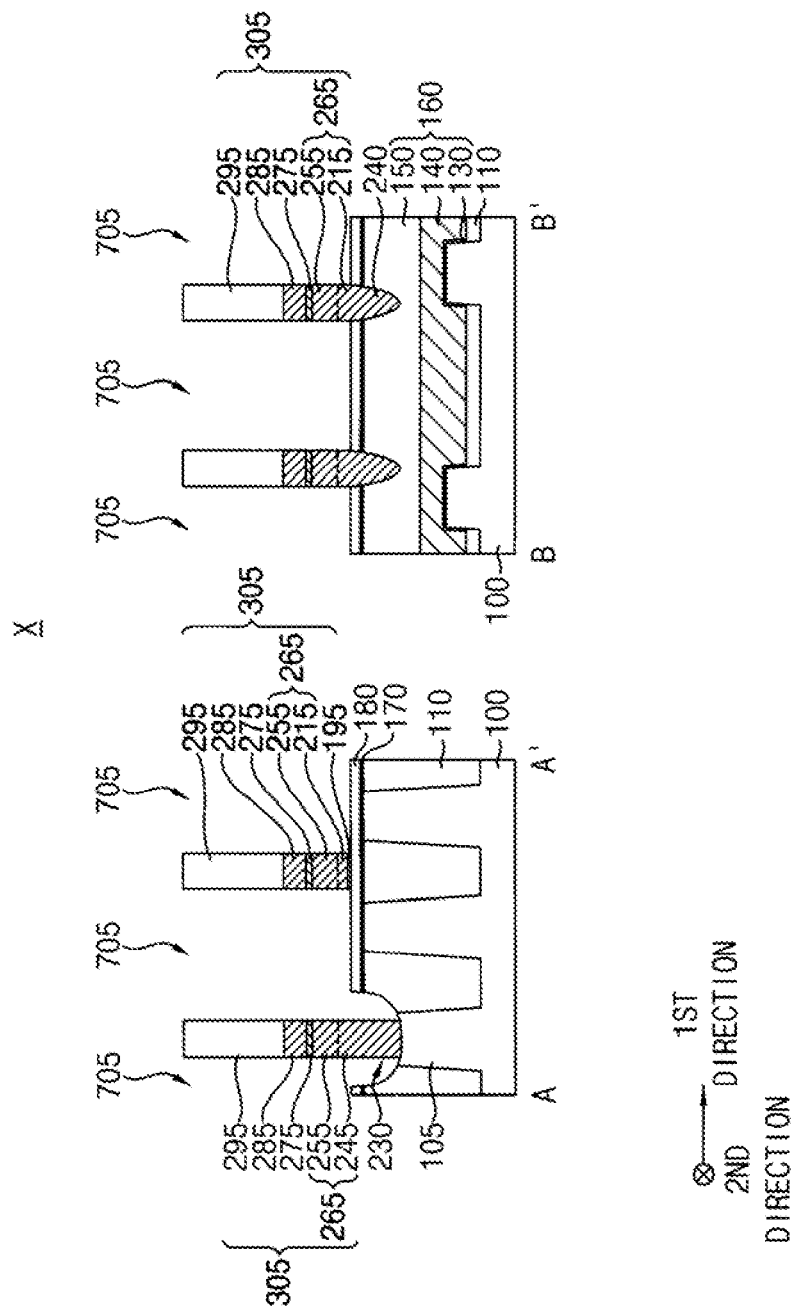

Referring to FIGS. 18 and 19, the capping layer 290 may be partially etched to form a first capping pattern 295, and the first metal layer 280, the barrier layer 270, the third conductive layer 250, the first and second conductive layers 210 and 240 and the third insulation layer 190 may be sequentially etched using the first capping pattern 295 as an etching mask.

The first capping pattern 295 may extend in the second direction, and a plurality of first capping patterns 295 may be spaced apart from each other in the first direction. By the etching process, a second conductive pattern 245, a third conductive pattern 255, a barrier pattern 275, a metal pattern 285 and the first capping pattern 295 may be sequentially stacked on the active pattern 105, the isolation pattern 110 and the gate mask 150 in the first opening 230, and a third insulation pattern 195, a first conductive pattern 215, the third conductive pattern 255, the barrier pattern 275, the metal pattern 285 and the first capping pattern 295 may be sequentially stacked on the second insulation layer 180 of the insulation layer structure 200 at an outside of the first opening 230.

As described above, the first to third conductive layers 210, 240 and 250 may be merged with each other, and thus the second and third conductive patterns 245 and 255 sequentially stacked and the first and third conductive patterns 215 and 255 sequentially stacked may form one conductive pattern structure 265, respectively. Hereinafter, the conductive pattern structure 265, the barrier pattern 275, the metal pattern 285, and the first capping pattern 295 sequentially stacked may be referred to as a bit line structure 305.

In an example embodiment, the bit line structure 305 may extend in the second direction, and a plurality of bit line structures 305 may be formed in the first direction.

A second opening 705 may be formed between neighboring ones of the bit line structures 305 in the first direction to expose an upper surface of the second insulation layer 180 and to be connected to the first opening 230.

Figure 20:
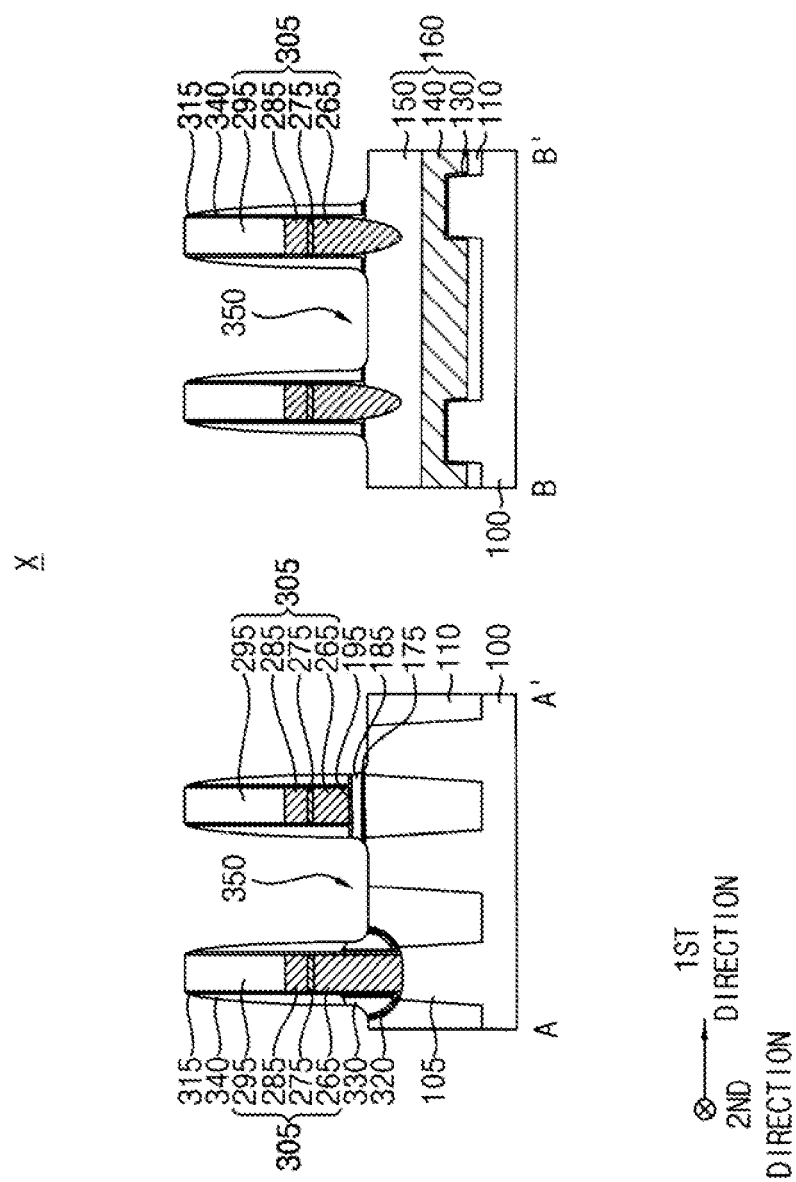

Referring to FIG. 20, a first spacer layer may be formed on the exposed upper surfaces of the active pattern 105, the isolation pattern 110 and the gate mask 150, a sidewall of the first opening 230, and the second insulation layer 180 to cover the bit line structure 305, and fourth and fifth insulation layers may be sequentially formed on the first spacer layer.

The first spacer layer may cover a sidewall of the third insulation pattern 195 under the bit line structure 305 on the second insulation layer 180, and the fifth insulation layer may entirely fill the first opening 230.

The fourth and fifth insulation layers may be etched by an etching process. In an example embodiment, the etching process may include a wet etching process, and all portions of the fourth and fifth insulation layers except for a portion thereof in the first opening 230 may be removed. Thus, almost an entire surface of the first spacer layer 310, that is, all portions of the first spacer layer 310 except for a portion thereof in the first opening 230, may be exposed. Portions of the fourth and fifth insulation layers remaining in the first opening 230 may form fifth and sixth insulation patterns 320 and 330, respectively.

A second spacer layer may be formed on the exposed surface of the first spacer layer and the portions of the fourth and fifth insulation patterns 320 and 330 in the first opening 230, and may be anisotropically etched to form a second spacer 340 on the surface of the first spacer layer and the fifth and sixth insulation patterns 320 and 330 to cover a sidewall of the bit line structure 305.

A dry etching process may be performed using the first capping pattern 295 and the second spacer 340 as an etching mask to form a third opening 350 exposing an upper surface of the active pattern 105, and upper surfaces of the isolation pattern 110 and the gate mask 150 may be also exposed by the third opening 350.

By the dry etching process, portions of the first spacer layer on the upper surfaces of the first capping pattern 295 and the upper surface of the second insulation layer 180 may be removed, and thus a first spacer 315 may be formed to cover the sidewall of the bit line structure 305. The first spacer 315 may include a nitride, e.g., silicon nitride. During the dry etching process, the first and second insulation layers 170 and 180 may be partially removed to form first and second insulation patterns 175 and 185, respectively, under the bit line structure 305. The first to third insulation patterns 175, 185 and 195 sequentially stacked under the bit line structure 305 may form an insulation pattern structure.

Figure 21:
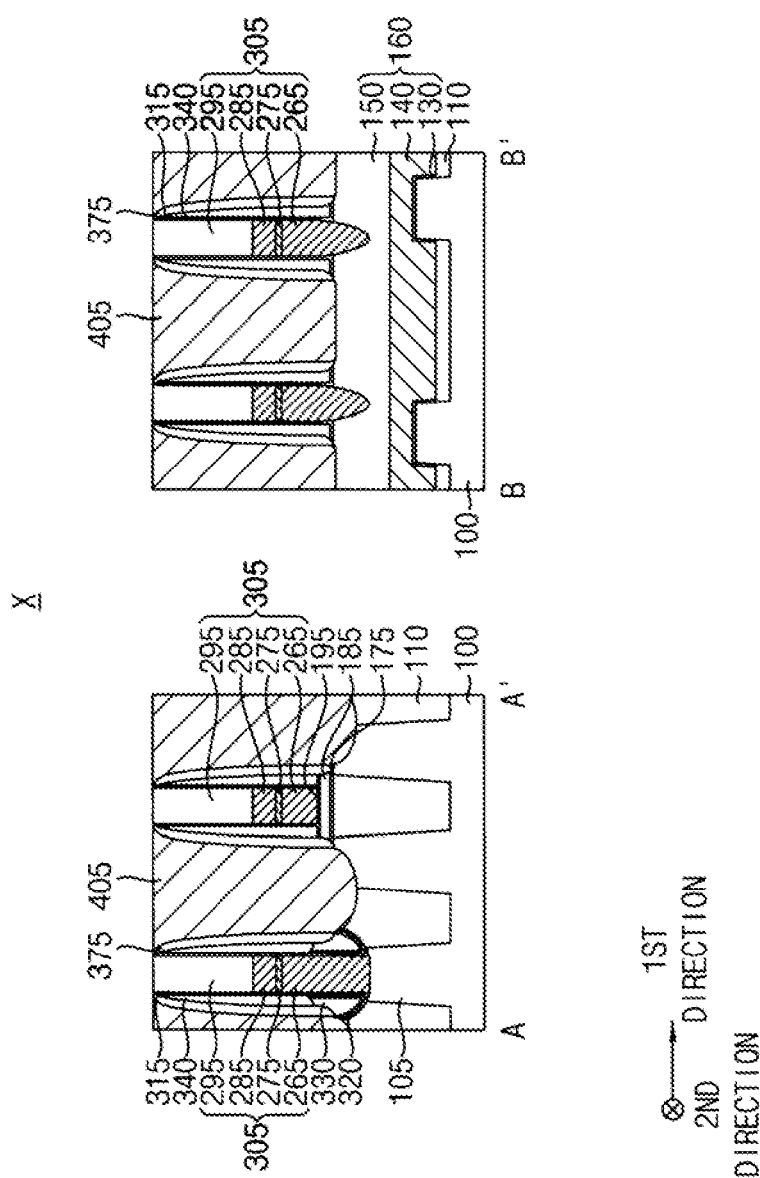

Referring to FIG. 21, a third spacer layer may be formed on an upper surface of the first capping pattern 295, an outer sidewall of the second spacer 340, portions of upper surfaces of the fifth and sixth insulation patterns 320 and 330, and the active pattern 105, the isolation pattern 110 and the upper surface of the gate mask 150 exposed by the third opening 350, and anisotropically etched to form a third spacer 375 covering the sidewall of the bit line structure 305. The third spacer 375 may include a nitride, e.g., silicon nitride. The third spacer 375 may include a nitride, e.g., silicon nitride.

The first to third spacers 315, 340, and 375 sequentially stacked on the sidewall of the bit line structure 305 in a horizontal direction substantially parallel to the upper surface of the substrate 100 may be referred to as a preliminary spacer structure.

An upper portion of the active pattern 105 may be etched to form a third recess 390 connected to the third opening 350.

A lower contact plug layer may be formed to fill the third opening 350 and the third recess 390. The lower contact plug layer may include, e.g., doped polysilicon.

The lower contact plug layer may be planarized until the upper surface of the first capping pattern 295 may be exposed to form a lower contact plug 405 between the bit line structures 305.

In an example embodiment, the lower contact plug 405 may extend in the second direction, and a plurality of lower contact plugs 405 may be formed in the first direction.

Figure 22:
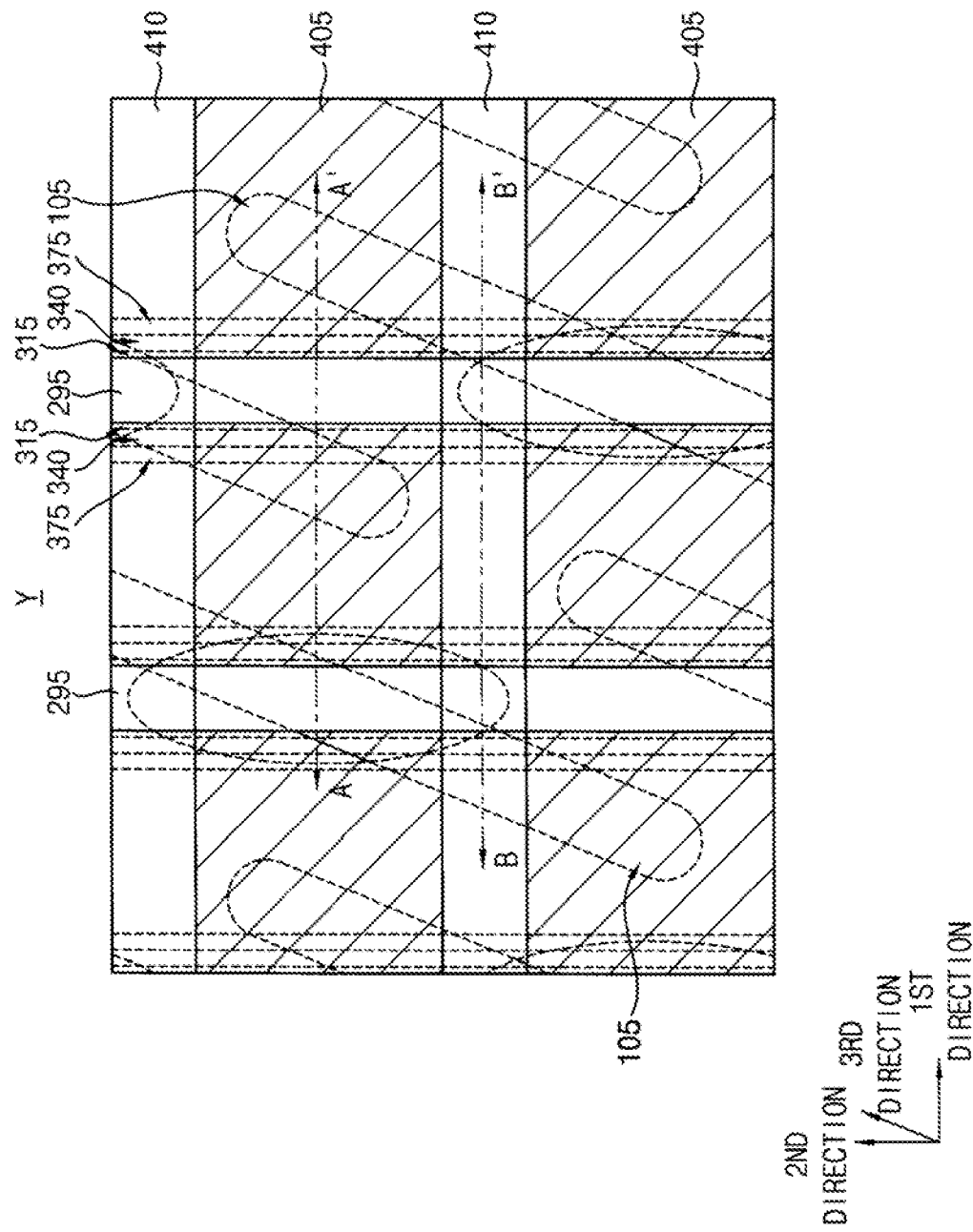
Figure 23:
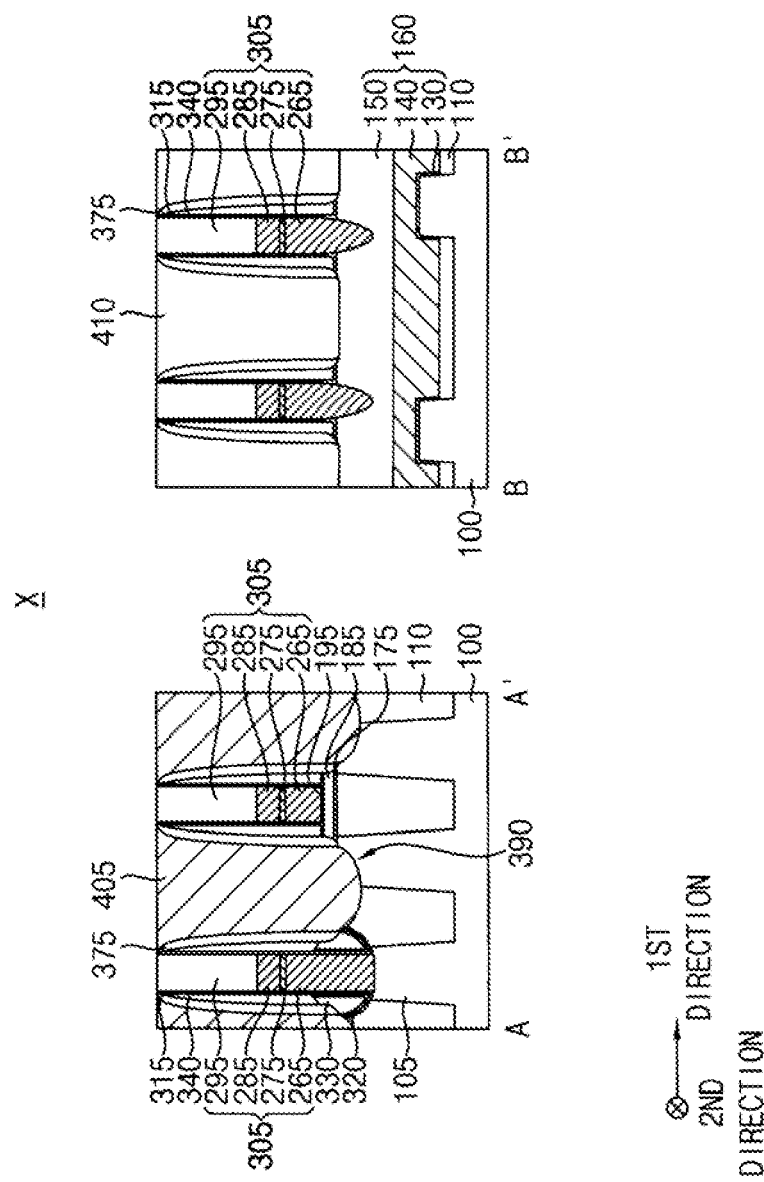

Referring to FIGS. 22 and 23, a second mask (not shown) including a plurality of fourth openings disposed in the second direction each of which may extend in the first direction may be formed on the first capping pattern and 295 and the lower contact plug 405, and the lower contact plug 405 may be etched using the fourth mask as an etching mask.

In an example embodiment, each of the fourth openings may overlap the gate structure 160 in a vertical direction substantially perpendicular to the upper surface of the substrate 100. By the etching process, a fifth opening may be formed to expose an upper surface of the gate mask 150 of the gate structure 160 between the bit line structures 305.

After removing the second mask, a second capping pattern 410 may be formed to fill the fifth opening. The second capping pattern 410 may include a nitride, e.g., silicon nitride. In an example embodiment, the second capping pattern 410 may extend in the first direction between the bit line structures 305, and a plurality of second capping patterns 410 may be formed in the second direction.

Thus, the lower contact plug 405 extending in the second direction between the bit line structures 305 may be divided into a plurality of pieces spaced apart from each other in the second direction by the second capping patterns 410.

Figure 24:
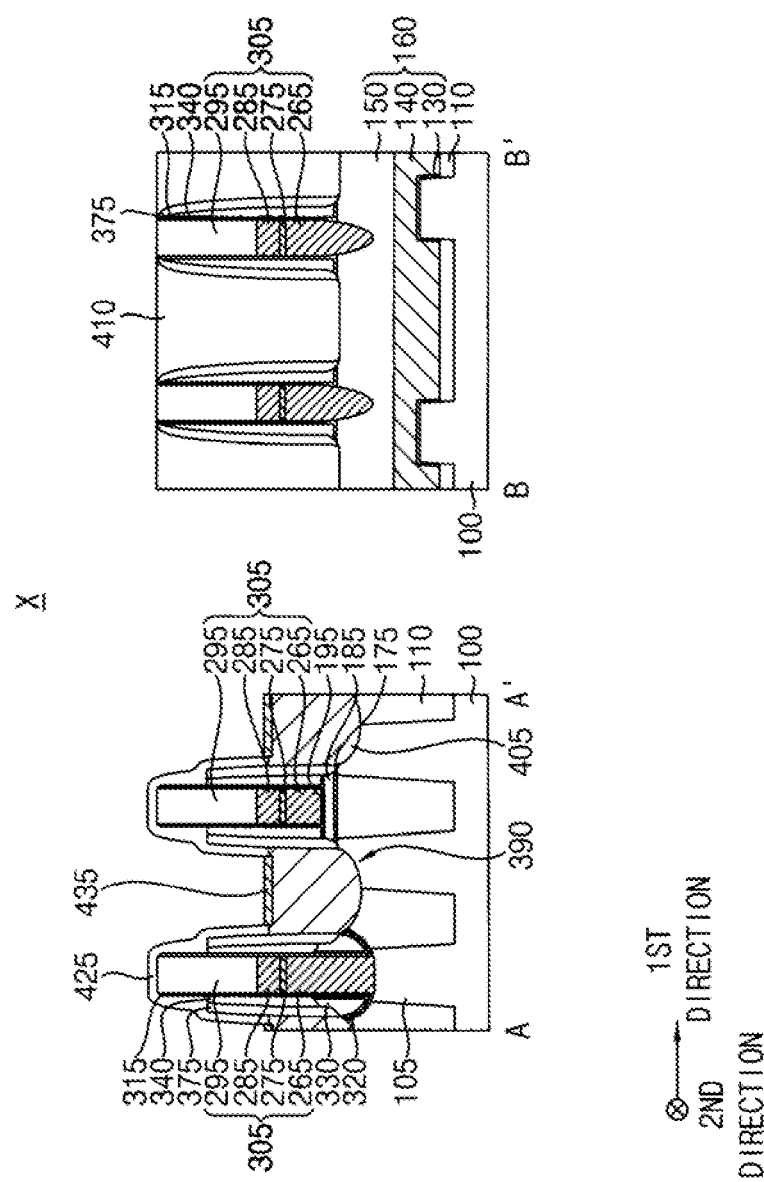

Referring to FIG. 24, an upper portion of the lower contact plug 405 may be removed.

In an example embodiment, the upper portion of the lower contact plug 405 may be removed by an etch back process. As the upper portion of the lower contact plug 405 is removed, an upper portion of the preliminary spacer structure on the sidewall of the bit line structure 305 may be exposed, and upper portions of the second and third spacers 340 and 375 of the exposed preliminary spacer structure may be removed.

An upper portion of the lower contact plug 405 may be further removed by, e.g., an etch back process. Thus, an upper surface of the lower contact plug 405 may be lowered than those of the second and third spacers 340 and 375.

A fourth spacer layer may be formed on the bit line structure 305, the preliminary spacer structure, the second capping pattern 410, and the lower contact plug 405, and anisotropically etched to form a fourth spacer 425 covering the first to third spacers 315, 340 and 375 on each of opposite sidewalls of the bit line structure 305 in the first direction, and thus the upper surface of the lower contact plug 405 may be exposed.

A metal silicide pattern 435 may be formed on the exposed upper surface of the lower contact plug 405. In an example embodiment, the metal silicide patterns 435 may be formed by forming a second metal layer on the first and second capping patterns 295 and 410, the fourth spacer 425, and the lower contact plug 405, performing a heat treatment thereon, and removing an unreacted portion of the second metal layer. The metal silicide pattern 435 may include, e.g., cobalt silicide, nickel silicide, titanium silicide, etc.

Figure 25:
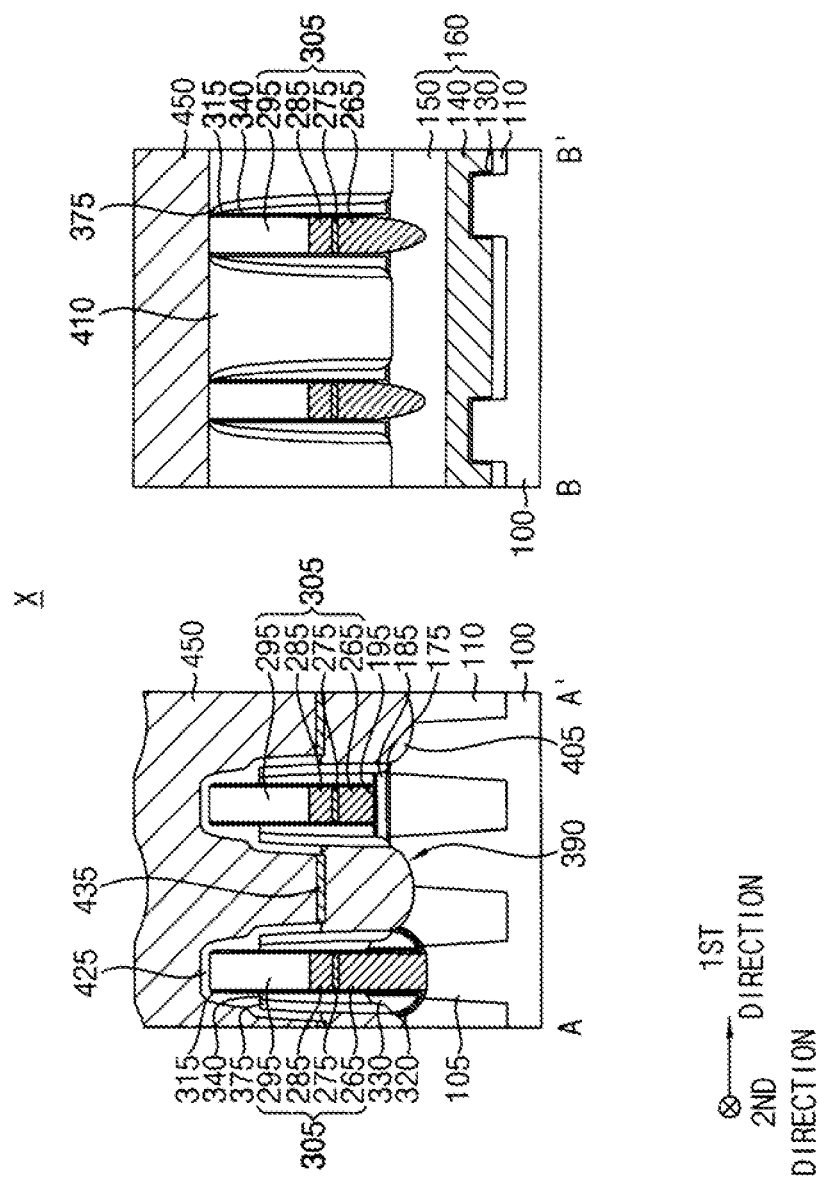

Referring to FIG. 25, an upper contact plug layer 450 may be formed on the first and second capping patterns 295 and 410, the first to fourth spacers 315, 340, 375, and 425, the metal silicide patterns 435, and the lower contact plug 405.

In an example embodiment, the upper contact plug layer 450 may include a metal, e.g., tungsten.

Figure 26:
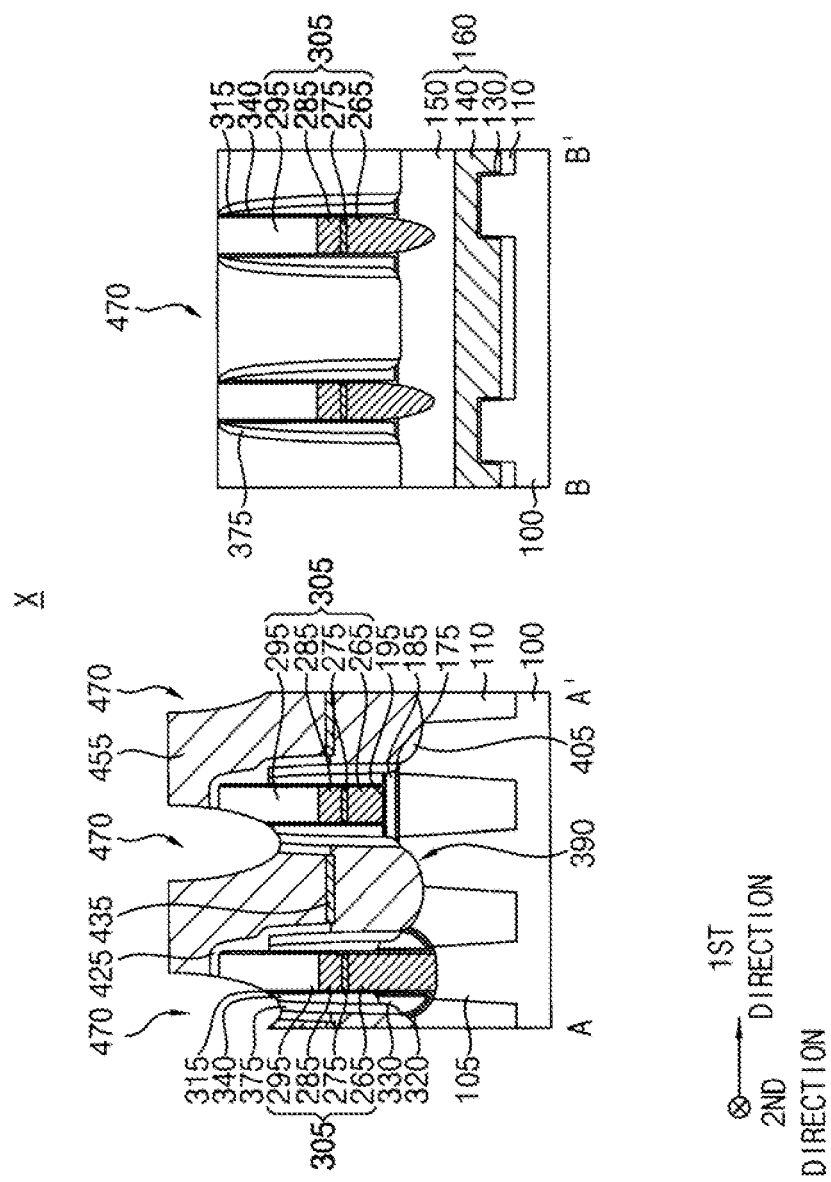

Referring to FIG. 26, the upper contact plug layer 450 may be planarized by, e.g., a CMP process.

A portion of the upper contact plug layer 450 may be partially removed to form a hole 470.

The hole 470 may be formed by removing a portion of the upper contact plug layer 450, an upper portion of the first capping pattern 295, and upper portions of the first, third and fourth spacers 315, 375, and 425, and thus an upper surface of the second spacer 340 may be exposed.

As the hole 470 is formed, the upper contact plug layer 450 may be transformed into an upper contact plug 455. In an example embodiment, a plurality of upper contact plugs 455 may be formed in each of the first and second directions, which may be arranged in honeycomb pattern. Each of the upper contact plugs 455 may have a shape of a circle, ellipse, or polygon, in a plan view.

The lower contact plug 405, the metal silicide pattern 435 and the upper contact plug 455 sequentially stacked may form a first contact plug structure.

Figure 27:
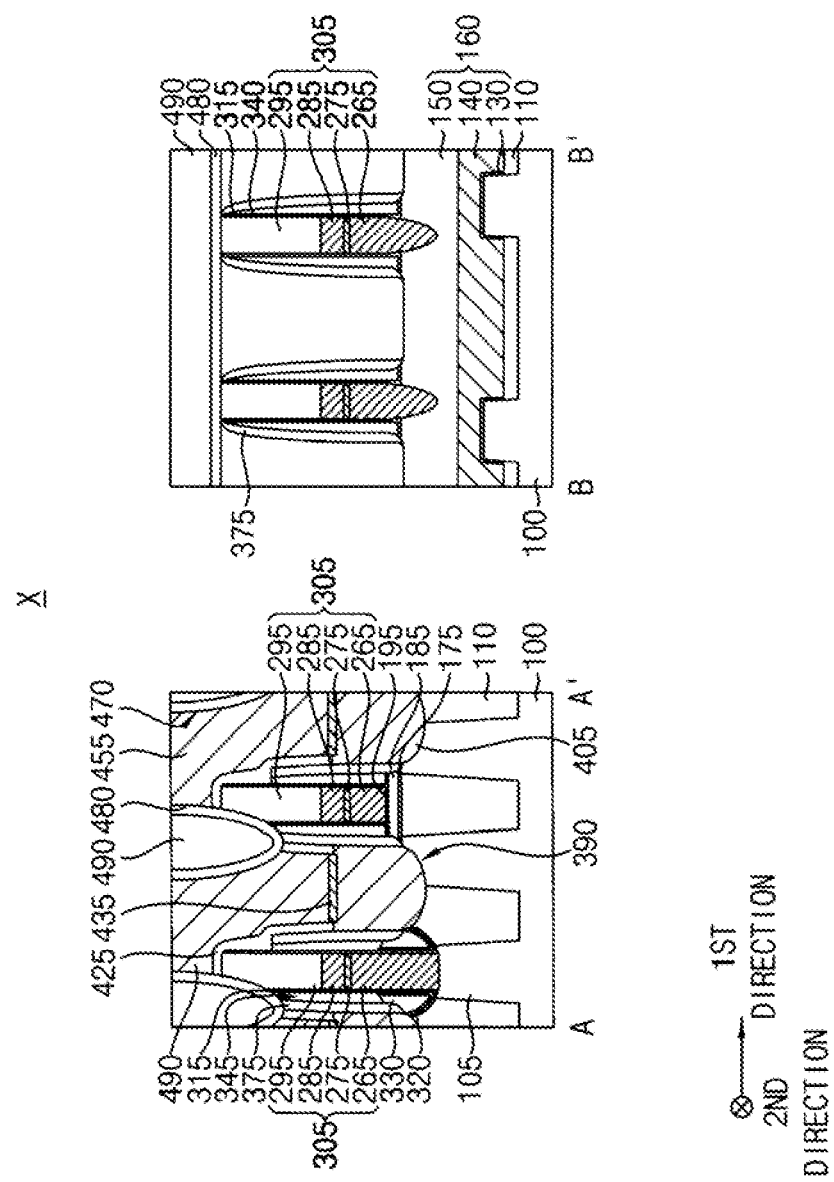

Referring to FIG. 27, the exposed second spacer 340 may be removed to form an air gap 345 connected to the hole 470. The second spacer 340 may be removed by, e.g., a wet etching process.

In an example embodiment, in the second spacer 340 on the sidewall of the bit line structure 305 extending in the second direction, not only a portion of the second spacer 340 exposed by the hole 470 but also a portion of the second spacer 340 parallel to the exposed portion thereof may be removed. Thus, not only a portion of the second spacer 340 exposed by the hole 470 not to be covered by the upper contact plug 455, but also a portion of the second spacer 340 adjacent thereto in the second direction to be covered by the second capping pattern 410, and a portion of the second spacer 340 adjacent thereto in the second direction to be covered by the upper contact plug 455 may be removed.

First and second insulating interlayers 480 and 490 sequentially stacked may be formed to fill the hole 470. The first and second insulating interlayers 480 and 490 may be also sequentially stacked on the second capping pattern 410.

The first insulating interlayer 480 may include a material having poor gap filling characteristics, and thus the air gap 345 under the hole 470 may not be filled with the first insulating interlayer 480 but remain. The air gap 345 may be also referred to as an air spacer, and may form a spacer structure together with the first, third, and fourth spacers 315, 375, and 425. Thus, the air gap 345 may be a spacer including air. The second insulating interlayer 490 may include a nitride, e.g., silicon nitride.

Figure 28:
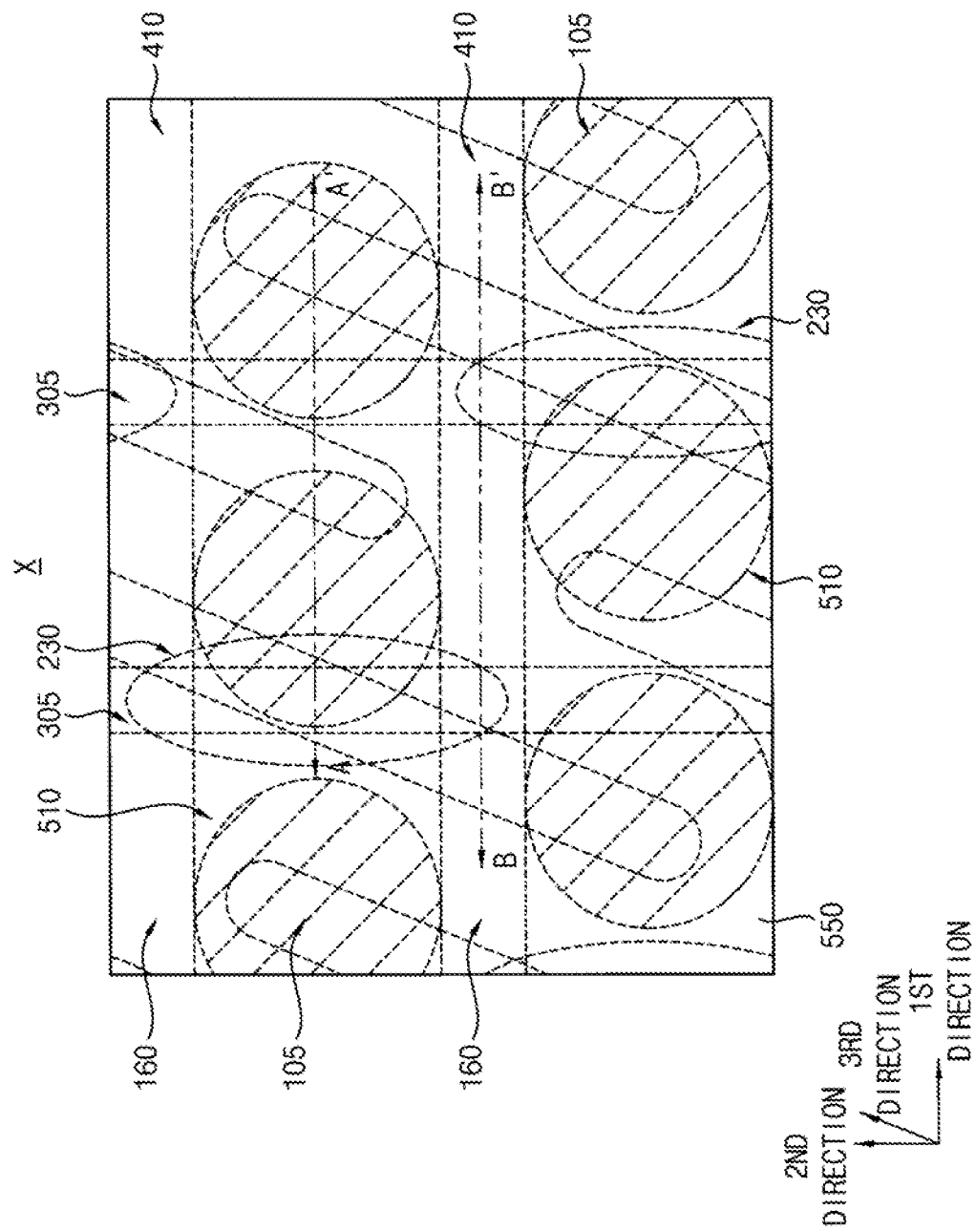
Figure 29:
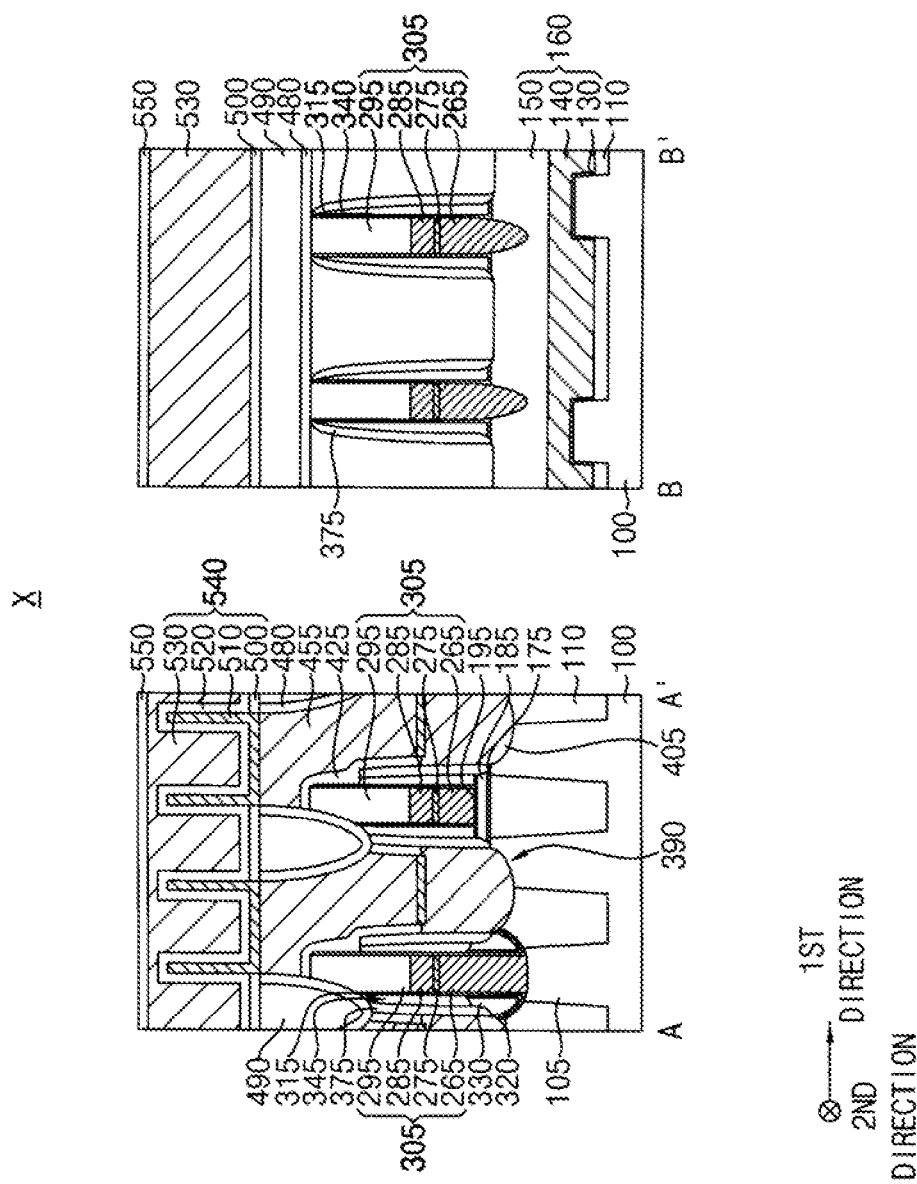

Referring to FIGS. 28 and 29, a capacitor 540 may be formed to contact an upper surface of the upper contact plug 455.

Thus, an etch stop layer 500 and a mold layer (not shown) may be sequentially formed on the upper contact plug 455, and the first and second insulating interlayers 480 and 490, and partially etched to form a sixth opening exposing an upper surface of the upper contact plug 455.

A lower electrode layer may be formed on a sidewall of the sixth opening, the exposed upper surface of the upper contact plug 455, and the mold layer, a sacrificial layer may be formed on the lower electrode layer to sufficiently fill a remaining portion of the sixth opening, and upper portions of the lower electrode layer and the sacrificial layer may be planarized until an upper surface of the mold layer may be exposed to divide the lower electrode layer. The remaining second sacrificial layer and the mold layer may be removed by, e.g., a wet etching process, and thus a cylindrical lower electrode 510 may be formed on the exposed upper surface of the upper contact plug 455. In another implementation, a pillar-type lower electrode filling the sixth opening may be formed.

A dielectric layer 520 may be formed on the lower electrode 510 and the etch stop layer 500, and an upper electrode 530 may be formed on the dielectric layer 520 to form a capacitor 540 including the lower electrode 510, the dielectric layer 520, and the upper electrode 530.

A third insulating interlayer 550 may be formed to cover the capacitor 540. The third insulating interlayer 550 may include an oxide, e.g., silicon oxide. An upper wiring (not shown) may be further formed on the third insulating interlayer 550 to complete the fabrication of the semiconductor device.

The method of designing the layout of the pattern, the method of forming the pattern, and the method of manufacturing the semiconductor device may be applied to methods of manufacturing logic devices such as CPU, MPU, AP, etc., volatile memory devices such as DRAM devices, SRAM devices, etc., or non-volatile memory devices such as PRAM devices, MRAM devices, RRAM devices, etc.

By way of summation and review, in consideration of the distortion of layouts of patterns during an exposure process, an optical proximity correction (OPC) may be performed after designing the layouts of patterns and before making a reticle. However, when the layouts of patterns have an edge with an angle with respect to a baseline that is not 0 degrees, 45 degrees, or 90 degrees, the OPC may not be automatically performed.

As described above, example embodiments may provide a method of designing a layout of a pattern. Example embodiments may also provide a method of forming a pattern using the method of designing the layout of the pattern. Example embodiments may also provide a method of manufacturing a semiconductor device using the method of designing the layout of the pattern.

As described above, in a method of designing a layout of a pattern in accordance with an example embodiment, an OPC may be automatically performed using computer programs by a computer or a processor even if a layout of an original pattern includes edges having an angle that is not 0 degrees, 45 degrees, or 90 degrees with respect to a reference line.

Various operations of methods described above may be performed as is suitable, such as by various hardware and/or software components, modules, and/or circuits. When implemented in software, the operations may be implemented using, for example, an ordered listing of executable instructions for implementing logical functions, and may be embodied in a processor-readable medium for use by or in connection with an instruction execution system, apparatus, or device, such as a single or multiple-core processor or processor-containing system.

In some embodiments, blocks or steps of a method or algorithm and functions described in connection with the embodiments disclosed herein may be embodied directly in hardware, in a software module executed by a processor, or in a combination of software and hardware. If implemented in software, the functions may be stored on or transmitted over as one or more instructions or code on a tangible, non-transitory computer-readable medium. A software module may reside in, for example, Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other suitable form of storage medium.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of designing a layout of a pattern, the method comprising:
    rotating a layout of an original pattern designed on a mask by a rotational angle in a first rotational direction to form a layout of a rotation pattern, the mask including reference points;
    matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern;
    enlarging a region of the layout of the first modification pattern to form a layout of a second modification pattern;
    forming a layout of a reference pattern having the same direction as the layout of the rotation pattern;
    forming a layout of a target pattern based on a region in which the layout of the reference pattern and the layout of the second modification pattern overlap each other;
    performing an optical proximity correction on the layout of the target pattern to form a layout of a third modification pattern; and
    rotating the layout of the third modification pattern by the rotational angle in a second rotational direction to form a layout of a final pattern, the second rotational direction being opposite to the first rotation direction.

2. The method as claimed in claim 1, wherein the reference points are arranged in a grid in the mask, and the layout of the original pattern has a shape of a polygon, vertices of the polygon overlapping ones of the reference points, respectively.

3. The method as claimed in claim 2, wherein:
    the mask includes a reference line extending in a first direction to pass through ones of the reference points and a reference vertex among the vertices of the layout of the original pattern, and
    at least one of edges of the layout of the original pattern has an angle with respect to the reference line, the angle being not any of 0 degrees, 45 degrees, and 90 degrees.

4. The method as claimed in claim 3, wherein:
    the layout of the rotation pattern is formed by rotating the original pattern about the reference vertex in the first rotational direction, and
    each of ones of edges of the layout of the rotation pattern has an angle of 0 degrees or 90 degrees with respect to the reference line, the ones of the edges of the layout of the rotation pattern meeting each other at the reference vertex.

5. The method as claimed in claim 3, wherein:
    each of the edges of the layout of the original pattern is divided into a plurality of segments by segment points,
    when forming the layout of the rotation pattern, ones of vertices and segment points of the layout of the rotation pattern corresponding to the vertices and segments, respectively, of the layout of the original pattern do not overlap the reference points, and
    the layout of the first modification pattern is formed by matching the ones of the vertices and the segment points of the layout of the rotation pattern not overlapping the reference points with corresponding ones of the reference points closest thereto, respectively, among the reference points.

6. The method as claimed in claim 3, wherein the layout of the second modification pattern is formed by elongating or moving each of edges of the layout of the first modification pattern in the first direction.

7. The method as claimed in claim 3, wherein the layout of the reference pattern includes:
    a first line extending in a second direction to pass through the reference vertex of the layout of the original pattern, the second direction perpendicular to the first direction; and
    a second line extending in the second direction to pass through ones of the reference points, the second line being spaced apart from the first line in the first direction by a distance close to a width in the first direction of the layout of the original pattern.

8. The method as claimed in claim 7, wherein the layout of the target pattern has a shape of a rectangle including:
    portions of the first and second lines of the layout of the reference pattern, each of the portions extending in the second direction between edges of the layout of the second modification pattern; and
    portions of the edges of the layout of the second modification pattern, each of the portions extending in the first direction between the first and second lines of the layout of the reference pattern.

9. The method as claimed in claim 1, wherein the optical proximity correction includes corner rounding correction of the layout of the target pattern.

10. The method as claimed in claim 9, wherein:
the layout of the target pattern includes target pattern edges, target pattern vertices, and target pattern segment points, the target pattern edges meeting each other at the target pattern vertices, the target pattern segment points overlapping corresponding ones of the reference points, respectively, and dividing each of the target pattern edges into a plurality of segments, and
the corner rounding correction of the layout of the target pattern is performed based on data about the target pattern vertices and the target pattern segment points.

11. The method as claimed in claim 1, wherein:
a plurality of layouts of the original pattern is designed to be spaced apart from each other in a first direction by a distance on the mask, and
a plurality of layouts of the rotation pattern, a plurality of layouts of the first modification pattern, a plurality of layouts of the second modification pattern, a plurality of layouts of the third modification pattern, a plurality of layouts of the reference pattern, a plurality of layouts of the target pattern, and a plurality of layouts of the final pattern are formed.

12. The method as claimed in claim 11, wherein the plurality of layouts of the reference pattern is formed correspondingly to the plurality of layouts of the second modification pattern, respectively, and are spaced apart from each other in the first direction by a distance.

13. The method as claimed in claim 1, wherein the rotating of the layout of the original pattern, the matching of the vertices and segment points of the layout of the rotation pattern with corresponding ones of the reference points, the enlarging of the region of the layout of the first modification pattern, the forming of the layout of the reference pattern, the forming of the layout of the target pattern, the performing of the optical proximity correction, and the rotating of the layout of the third modification pattern are automatically performed by a computer processor.

14. A method of forming a pattern, the method comprising:
designing a layout of a final pattern on a mask, including:
rotating a layout of an original pattern designed on the mask by a rotational angle in a first rotational direction to form a layout of a rotation pattern, the mask including reference points;
matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern;
enlarging a region of the layout of the first modification pattern to form a layout of a second modification pattern;
forming a layout of a reference pattern having the same direction as the layout of the rotation pattern;
forming a layout of a target pattern based on a region in which the layout of the reference pattern and the layout of the second modification pattern overlap each other;
performing an optical proximity correction on the layout of the target pattern to form a layout of a third modification pattern; and
rotating the layout of the third modification pattern by the rotational angle in a second rotational direction to form the layout of the final pattern, the second rotational direction being opposite to the first rotation direction; and
forming the pattern on a substrate using the mask on which the layout of the final pattern is designed.

15. The method as claimed in claim 14, wherein an etching object layer and a photoresist layer are sequentially stacked on the substrate, and forming the pattern on the substrate includes:
performing an exposure process using the mask on which the layout of the final pattern is designed so that the layout of the final pattern is transferred to the photoresist layer, the photoresist layer having a layout of a pattern;
performing a developing process so as to transform the photoresist layer into a photoresist pattern having the layout of the pattern; and
etching the etching object layer using the photoresist pattern as an etching mask.

16. The method as claimed in claim 15, wherein the layout of the pattern of the photoresist layer is similar to the layout of the original pattern designed on the mask.

17. The method as claimed in claim 15, wherein an etching mask layer is further formed between the etching object layer and the photoresist layer on the substrate, and etching the etching object layer using the photoresist pattern includes:
etching the etching mask layer using the photoresist pattern to form an additional etching mask; and
etching the object layer using the additional etching mask.

18. The method as claimed in claim 14, wherein:
the reference points are arranged in a grid in the mask, and
vertices of the layout of the original pattern overlap ones of the reference points, respectively.

19. The method as claimed in claim 18, wherein:
the mask includes a reference line extending in a first direction to pass through ones of the reference points and a reference vertex among the vertices of the layout of the original pattern, and
at least one of edges of the layout of the original pattern has an angle with respect to the reference line, the angle being not any of 0 degrees, 45 degrees, and 90 degrees.

20. A method of manufacturing a semiconductor device, the method comprising:
designing a layout of a final pattern on a mask, including:
rotating a layout of an original pattern designed on the mask by a rotational angle in a first rotational direction to form a layout of a rotation pattern, the mask including reference points;
matching vertices and segment points of the layout of the rotation pattern with corresponding ones of the reference points, respectively, of the mask, and connecting the matched reference points to form a layout of a first modification pattern, the corresponding ones of the reference points among the reference points of the mask being closest to the vertices and the segment points, respectively, of the layout of the rotation pattern;
enlarging a region of the layout of the first modification pattern to form a layout of a second modification pattern;

forming a layout of a reference pattern having the same direction as the layout of the rotation pattern;

forming a layout of a target pattern based on a region in which the layout of the reference pattern and the layout of the second modification pattern overlap each other;

performing an optical proximity correction on the layout of the target pattern to form a layout of a third modification pattern; and rotating the layout of the third modification pattern by the rotational angle in a second rotational direction to form the layout of the final pattern, the second rotational direction being opposite to the first rotation direction;

forming an active pattern on a substrate using the mask on which the layout of the final pattern is designed;

forming a gate structure at an upper portion of the active pattern;

forming a bit line structure on a portion of the active pattern;

forming a contact plug structure on a portion of the active pattern; and forming a capacitor on the contact plug structure.

* * * * *